United States Patent
Wang et al.

(10) Patent No.: US 9,240,799 B1
(45) Date of Patent: Jan. 19, 2016

(54) SPIN-BASED LOGIC DEVICE

(71) Applicant: Regents of the University of Minnesota, Minneapolis, MN (US)

(72) Inventors: Jian-Ping Wang, Shoreview, MN (US); Yang Lv, New Brighton, MN (US); Yanfeng Jiang, Minneapolis, MN (US); Mahdi Jamali, Minneapolis, MN (US)

(73) Assignee: Regents of the University of Minnesota, Minneapolis, MN (US)

(*) Notice: Subject to any disclaimer, the term of this patent is extended or adjusted under 35 U.S.C. 154(b) by 0 days.

(21) Appl. No.: 14/532,746

(22) Filed: Nov. 4, 2014

(51) Int. Cl.
| | |
|---|---|
| *H03M 1/00* | (2006.01) |
| *H03M 1/12* | (2006.01) |
| *H03M 1/14* | (2006.01) |
| *H01L 29/66* | (2006.01) |
| *H03L 7/26* | (2006.01) |

(52) U.S. Cl.
CPC ......... *H03M 1/124* (2013.01); *H01L 29/66984* (2013.01); *H03L 7/26* (2013.01); *H03M 1/142* (2013.01)

(58) Field of Classification Search
CPC ..... H03M 1/142; H03M 1/361; H03M 1/747; H03M 1/685; H03M 1/124; H01L 29/66984; H01L 21/8252; H01L 21/23828; H01L 43/02; H01L 43/12; G11C 5/147; G11C 11/15; H03B 15/006; H03L 5/00; H03L 7/26
USPC .................. 257/195, 421, E29.246; 365/158; 438/3; 331/177 R; 341/122–155
See application file for complete search history.

(56) References Cited

U.S. PATENT DOCUMENTS

| | | | | |
|---|---|---|---|---|
| 5,654,566 | A * | 8/1997 | Johnson ................. | G11C 11/16 257/295 |
| 6,393,923 | B1 * | 5/2002 | Holt ..................... | G01M 11/088 356/124.5 |
| 6,476,753 | B1 * | 11/2002 | Hansen ................. | H03M 1/142 341/155 |
| 7,180,087 | B1 * | 2/2007 | Loss ..................... | B82Y 10/00 257/9 |

OTHER PUBLICATIONS

Allwood et al., "Magnetic Domain-Wall Logic," Science, vol. 309(5741), Sep. 2005, 6 pp.
Duan et al., "Surface Magnetoelectric Effect in Ferromagnetic Metal Films," Physical Review Letters, vol. 101, Sep. 2008, 6 pp.
Harms et al., "SPICE Macromodel of Spin-Torque-Transfer-Operated Magnetic Tunnel Junctions," IEEE Transactions on Electron Devices, vol. 57(6), Jun. 2010, 6 pp.
Jiang et al., "Magnetic Tunnel Junction-Based Spin Register for Nonvolatile Integrated Circuits," IEEE Transactions on Electron Devices, vol. 59(11), Nov. 2012, 7 pp.
(Continued)

*Primary Examiner* — Lam T Mai
(74) *Attorney, Agent, or Firm* — Shumaker & Sieffert, P.A.

(57) ABSTRACT

A device including a conductive layer configured to output a spin-current based on an analog input value, a plurality of magnetoresistive devices, and an encoder configured to output a digital value. Each of the magnetoresistive devices may be configured to receive a different reference voltage on a first side and the spin-current on a second side. The magnetization state of each of the magnetoresistive devices is set by respective reference voltages and the spin-current. The encoder may include a plurality of digital bits that is a digital representation of the analog input value based on the magnetization states of the magnetoresistive devices.

23 Claims, 11 Drawing Sheets

(56) References Cited

OTHER PUBLICATIONS

Jonsson, "A Survey of A/D-Converter Performance Evolution," Proceedings of IEEE International Conference on Electronics, Circuits, and Systems, ICECS, Dec. 2010, 4 pp.

Jonsson, "On CMOS Scaling and A/D-Converter Performance," NORCHIP 2010, Nov. 2010, 4 pp.

Kaka et al., "Mutual Phase-Locking of Microwave Spin Torque Nano-Oscillators," Nature, vol. 437, Sep. 2005, 4 pp.

Kishi et al., "Lower-Current and Fast Switching of a Perpendicular TMR for High Speed and High Density Spin-Transfer-Torque MRAM," in International Electron Devices Meeting, IEDM, Dec. 2008, 4 pp.

Le et al., "Analog-to-Digital Converters," IEEE Signal Processing Magazine, Nov. 2005, 10 pp.

Le et al., "Performance Analysis of Optimised CMOS Comparator," Electronics Letters, vol. 39(11), May 2003, 4 pp.

Liu et al., "Spin-Torque Switching with the Giant Spin Hall Effect of Tantalum," Science, May 2012, 5 pp.

Maruyama et al., "Large Voltage-Induced Magnetic Anisotropy Change in a Few Atomic Layers of Iron," Nature Nanotechnology, vol. 4, Jan. 2009, 4 pp.

Patil et al., "Design of a Spintronic Arithmetic and Logic Unit Using Magnetic Tunnel Junctions," Proceedings of the 2008 Computing Frontiers Conference, May 2008, 9 pp.

Shikata et al., "A 0.5 V 1.1 MS/sec 6.3 fJ/Conversion-Step SAR-ADC with Tri-Level Comparator in 40 nm CMOS," IEEE Journal of Solid-State Circuits, vol. 47(4), Apr. 2012, 11 pp.

Wang et al., "Electric-field-assisted Switching in Magnetic Tunnel Junctions," Nature Materials, vol. 11, Nov. 2011, 7 pp.

* cited by examiner

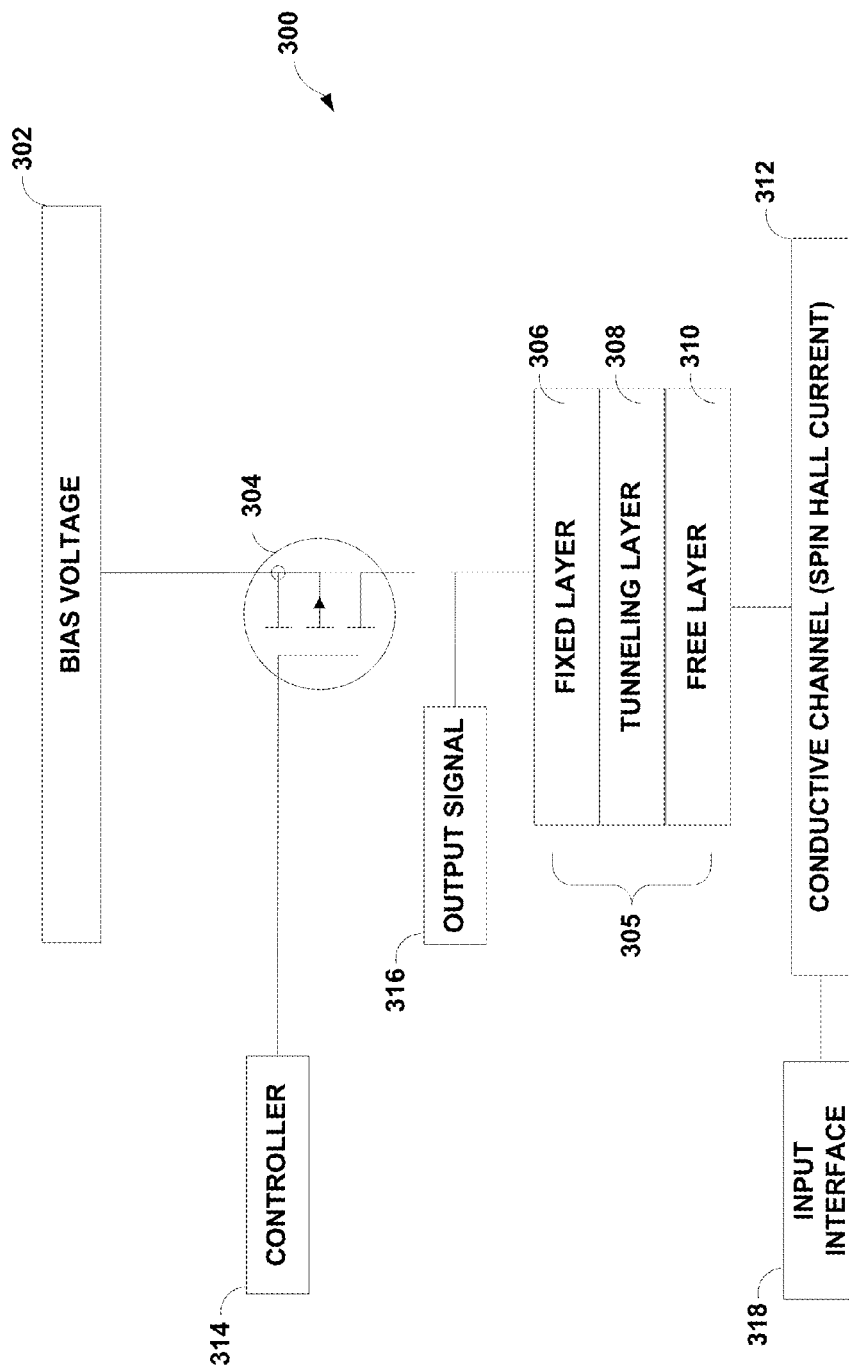

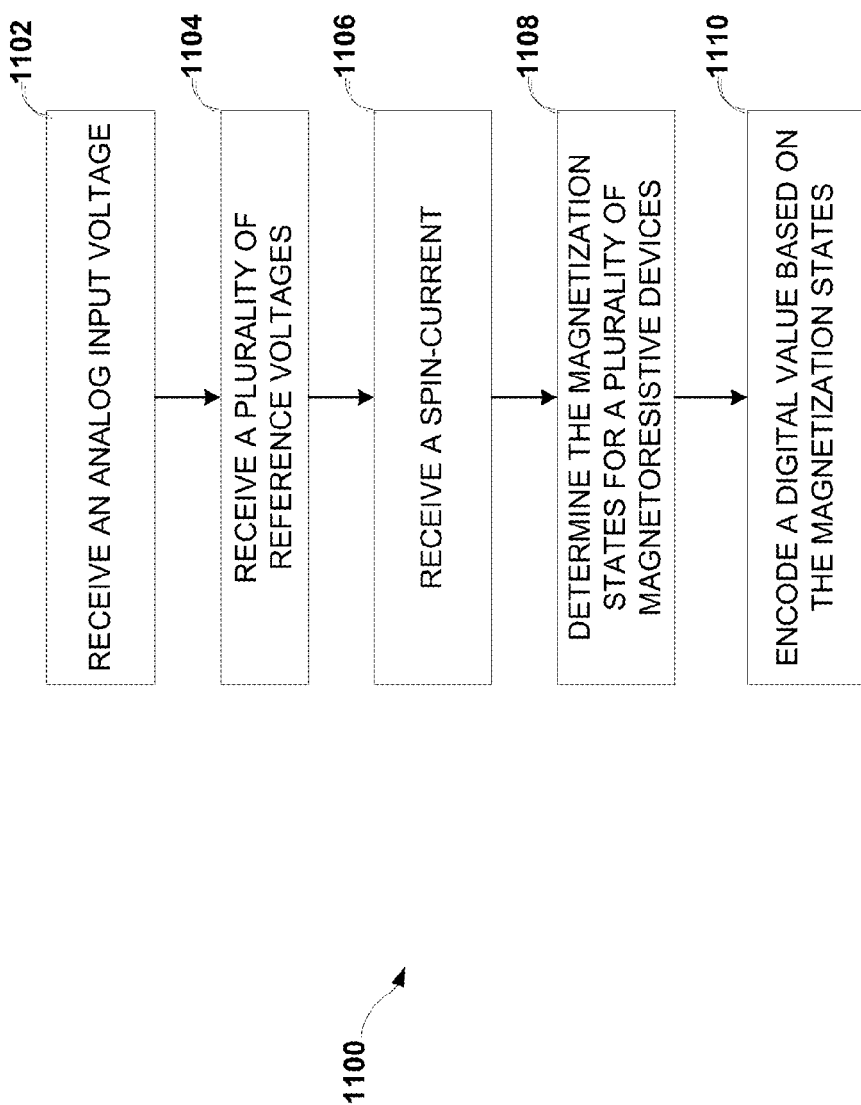

SPIN-BASED LOGIC DEVICE

GOVERNMENT INTEREST

This invention was made with government support under HR0011-13-3-0002 awarded by DARPA. The government has certain rights in the invention.

TECHNICAL FIELD

The disclosure relates to electronic systems and, more specifically, spin-based logic systems.

BACKGROUND

Analog-to-digital converters (ADCs) act as a bridge between analog and digital systems by translating analog signals representing physical quantities (e.g., light, sound, temperature or pressure) to digital signals that can easily be processed by computer or other digital circuitry. One example implementation of an ADC is a transistor-based flash-ADC that provides relatively fast conversion of the analog signal to the digital signal. However, conventional transistor-based flash-ADCs tend to consume relatively high amounts of power and require relatively large areas within integrated circuits.

SUMMARY

The disclosure describes a spin-based analog-to-digital converter (ADC). In one example implementation, the ADC may include a plurality of high-speed, low-power magnetoresistive devices that each function as comparators. The magnetization states of the magnetoresistive devices indicate whether an analog input value is greater than or less than reference voltages applied to each of the respective magnetoresistive devices. The ADC outputs a digital value that represents the analog input value based on the magnetization states of the magnetoresistive devices, thereby converting the analog input value to the digital value (i.e., to perform the analog-to-digital conversion).

The examples described herein may provide certain advantages. For example, an ADC that utilizes magnetoresistive devices as comparators for analog-to-digital conversion, as described in this disclosure, may require less chip area and lower power as compared to an ADC that relies predominately on transistors to form the comparators. Moreover, the magnetization states of the magnetoresistive devices can be set relatively fast allowing for a high sampling rate and faster analog-to-digital conversion as compared to other ADCs.

In some examples, the disclosure describes a device including a conductive layer configured to output a spin-current based on an analog input value, a plurality of magnetoresistive devices, and an encoder configured to output a digital value. Each of the magnetoresistive devices may be configured to receive a different reference voltage on a first side and the spin-current on a second side. The magnetization state of each of the magnetoresistive devices is set by respective reference voltages and the spin-current. The encoder may include a plurality of digital bits that is a digital representation of the analog input value based on the magnetization states of the magnetoresistive devices.

In some examples, the disclosure describes an analog-to-digital converter (ADC) including a first magnetoresistive device configured to receive a first reference voltage and a spin-current and a second magnetoresistive device configured to receive a second, different reference voltage and the spin-current. The amplitude of the spin-current is based on an amplitude of an analog input value. The first reference voltage and the spin-current set a magnetization state of the first magnetoresistive device to a first magnetization state. The second reference voltage and the spin-current set a magnetization state of the second magnetoresistive device to a second magnetization state. The first magnetization state and the second magnetization state are used to determine a digital value that includes a plurality of digital bits and that is a digital representation of the analog input value.

In some examples, the disclosure describes a method for analog-to-digital conversion including receiving an analog input voltage, the method includes receiving, with a plurality of magnetoresistive devices, a spin-current, wherein the spin-current is based on the analog input voltage, receiving, with the plurality of magnetoresistive device, reference voltages, where each of the reference voltages is different and is applied to a respective one of the magnetoresistive devices, determining magnetization states for each of the magnetoresistive devices, where the magnetization state of each of the magnetoresistive devices is set by the received spin-current and the received respective reference voltage, and encoding a digital value including a plurality of digital bits based on the determined magnetization states, where the digital value represents the analog input voltage.

In some examples, the disclosure describes a comparator including a reference voltage, a conductive layer configured to output a spin-current based on an analog input value, and a magnetoresistive device configured to receive the reference voltage and the spin-current. The reference voltage and the spin-current set a magnetization state of the magnetoresistive device. The magnetization state of the magnetoresistive device is indicative of whether the reference voltage is greater than or less than the analog input value.

In some examples, the disclosure describes an analog-to-digital converter (ADC) comprising a first magnetoresistive device configured to receive a first reference voltage and an analog magnetic value. The first reference voltage and an amplitude of the analog magnetic value set a magnetization state of the first magnetoresistive device to a first magnetization state. The ADC also includes a second magnetoresistive device configured to receive a second, different reference voltage and the analog magnetic value. The second reference voltage and the amplitude of the analog magnetic value set a magnetization state of the second magnetoresistive device to a second magnetization state. In this example, the first magnetization state and the second magnetization state are used to determine a digital value that includes a plurality of digital bits and that is a digital representation of the analog magnetic value.

In some examples, the disclosure describes a device comprising a plurality of magnetoresistive devices, each configured to receive a different reference voltage on a first side and an analog magnetic value on a second side, wherein a magnetization state of each of the magnetoresistive devices is set by respective reference voltages and an amplitude of the analog magnetic value. The device also includes an encoder configured to output a digital value including a plurality of digital bits that is a digital representation of the analog magnetic value based on the magnetization states of the magnetoresistive devices.

The details of one or more examples of the disclosure are set forth in the accompanying drawings and the description below. Other features, objects, and advantages of the disclosure will be apparent from the description and drawings, and from the claims.

BRIEF DESCRIPTION OF DRAWINGS

FIGS. 3A and 3B are block diagrams illustrating an example comparator in accordance with one or more aspects of the present disclosure.

FIG. 11 is a flowchart illustrating operation of an example ADC in accordance with one or more aspects of the present disclosure.

DETAILED DESCRIPTION

Figure 1:
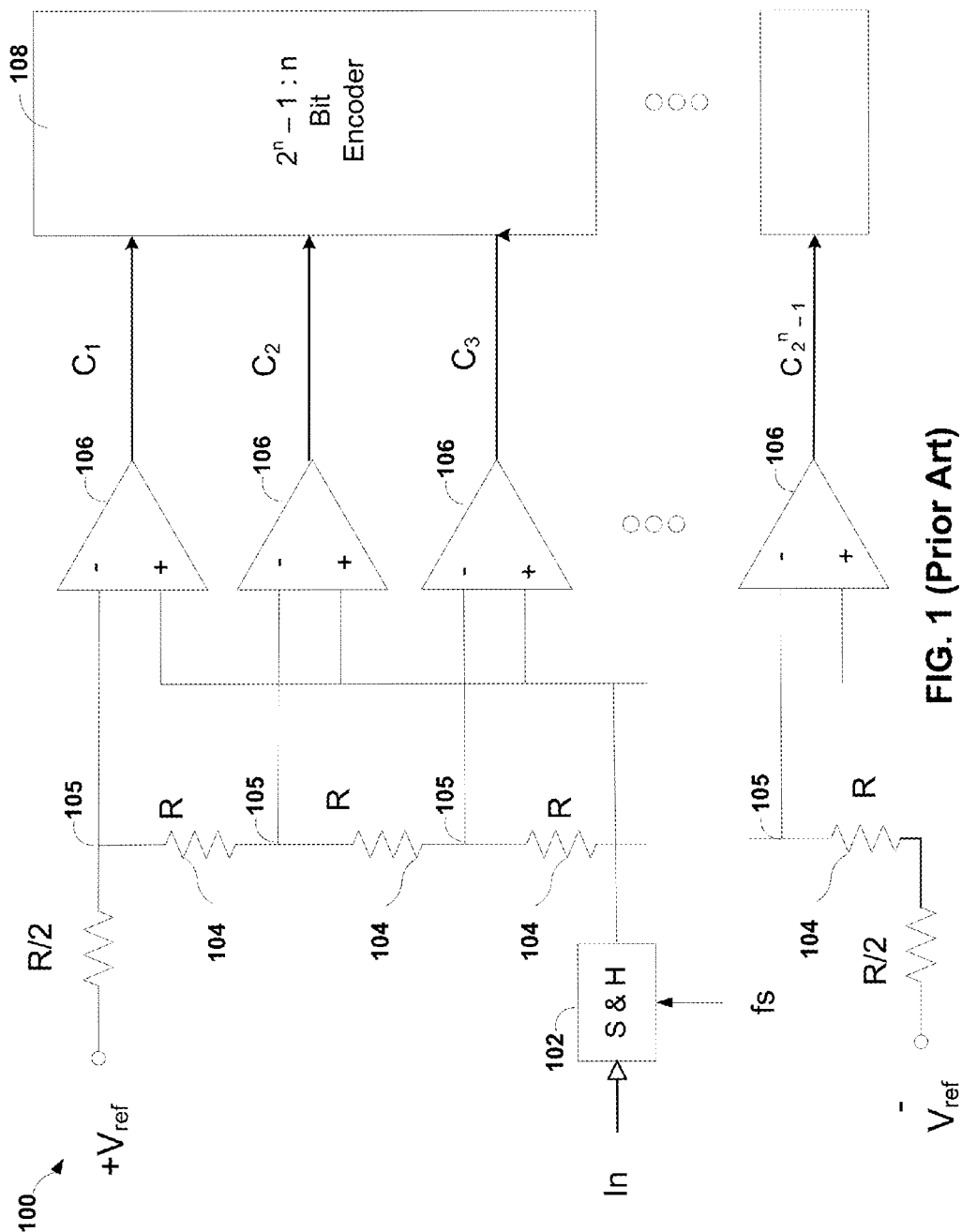
FIG. 1 is a block diagram illustrating an example of a conventional analog-to-digital converter (ADC).

There are many types of analog-to-digital converters (ADCs). Flash ADCs, also known as parallel ADCs, have gained popularity in some applications because they operate extremely fast relative to other types of ADCs. Further, flash ADCs are particularly useful in applications that require very large bandwidth. In some examples, flash ADCs include a resistor ladder with a comparator at each rung of the ladder (e.g., the comparator is connected to taps between the resistors in the resistor ladder). The comparators compare an analog input value (e.g., an analog voltage) to successive reference voltages. A digital encoder receives the outputs from the comparators and converts the analog input value into a digital, binary value.

Flash ADCs require a large number of comparators in comparison to other types of ADCs. The comparators of flash ADCs are typically transistor based and occupy a large chip area, consume large amounts of power, and can be expensive. Although there may be drawbacks with transistor based comparators, comparators generally may be needed as building blocks in high-speed flash ADCs.

This disclosure describes ADCs that utilize magnetoresistive devices as comparators instead of utilizing solely transistor-based comparators. The magnetoresistive devices are smaller, consume less power, and provide faster comparison between the analog input value and the reference voltages as compared to transistor-based comparators. In this way, the techniques described in this disclosure provide for high-speed ADCs that require less power and less area as compared to other types of ADCs including other types of flash ADCs.

For instance, as described herein, a magnetization state of a magnetoresistive device may be controlled and used to indicate a result of a comparison between an analog input value and a reference voltage. An impedance of the magnetoresistive device varies based on the magnetization state of the magnetoresistive device, and the impedance of the magnetoresistive device may be used, as described herein, to indicate the result of the comparison between the analog input value and the reference voltage.

For example, in a parallel magnetization state, the impedance of the magnetoresistive device is low, and the impedance being low may, in some examples, be used to indicate that the reference voltage is greater than the analog input value. In an anti-parallel magnetization state, the impedance of the magnetoresistive device is high, and the impedance being high may, in some examples, indicate that the reference voltage is less than the analog input value, or vice-versa. The magnetization state may be read out from the measurement of the impedance value (also referred to as the resistance value) of the magnetoresistive devices (e.g., low resistance for the parallel magnetization state and high resistance for the anti-parallel magnetization state, or vice-versa).

Magnetoresistive devices, such as magnetic tunnel junction (MTJ) or giant magnetoresistive (GMR) devices, are used as nonvolatile storage elements in memory devices such as magnetic random access memory (MRAM), fast programmable logic, high-density recording, and high frequency devices for telecommunications. The techniques described in this disclosure utilize magnetoresistive devices, not necessarily for memory devices, but as comparators for ADCs (e.g., for logic computation).

The disclosure describes example implementations of a spintronic ADC. In some examples, the ADC includes a resistor ladder with a comparator at each rung of the ladder. The comparators each include a magnetoresistive device, and such comparators may require less power and area than transistor-based comparators. Accordingly, the described ADC may achieve lower-power consumption compared to traditional flash ADCs because the magnetoresistive devices as comparators use less power than transistor-based comparators. The described ADC may also occupy less chip area than traditional flash ADCs because the magnetoresistive devices as comparators occupy less area than transistor-based comparators. While the ADC described in this disclosure may consume less power and require less area, the described ADC may retain the high sampling rate of traditional flash ADCs, as well as provide non-volatile storage capabilities. For example, the magnetoresistive devices of the ADCs may retain their state even if the magnetoresistive device is not receiving power. However, transistor-based comparators lose their state when not receiving power.

It should be understood that the magnetoresistive device based comparators being used as comparators for a flash ADC is provided as one example. The techniques described in this disclosure should not be considered limited only to examples where the magnetoresistive device based comparators are being used as comparators for a flash ADC. The magnetoresistive device based comparators, as described in this disclosure, may be used as comparators for various types of components, including various types of ADCs (and not just flash ADCs).

FIG. 1 is a block diagram illustrating an example of a conventional flash-based analog-to-digital converter (ADC). Flash-ADC 100 may include a resistor ladder, sample-and-hold (S&H) input 102, a plurality of comparators 106, and at least one encoder 108. In the example of FIG. 1, encoder 108 is an n-bit encoder, where n represents the number of digital bits in the converted digital value and is a positive integer. For instance, ADC 100 may convert an analog input value into a digital value that includes 16 digital bits (i.e., ADC 100 has a resolution of 16 bits). In this example, n equals 16, and encoder 108 is a 16-bit encoder.

As shown in FIG. 1, the resistor ladder receives a reference voltage $V_{ref}$ and includes a series of "rungs." Each rung includes a resistor 104 and a tap 105 after each resistor 104. Since a voltage drop occurs across each resistor 104 in the ladder, the reference voltage at each successive rung of the ladder will have a lower voltage than the preceding rung. The resistance of each resistor 104 in the resistor ladder may the same in some examples, and in other examples, the resistance of two or more may be different.

Flash-ADC 100 includes a plurality of comparators 106. As illustrated, flash-ADC includes $2^n-1$ comparators, where n is the number of bits outputted by ADC 100. Thus, a 2-bit ADC would require 3 comparators, a 3-bit ADC would require 7 comparators, a 4-bit ADC would require 15 comparators, and so on.

Each of the respective comparators 106 includes a plurality of inputs. As illustrated, the comparator inputs may include respective reference voltages at tap 105 and the output of S&H circuit 102. Each comparator 106 may include circuitry to compare the inputs (e.g., the respective reference voltages at tap 105 and the output of S&H circuit 102) and output a logical value (i.e., 0 or 1) based on the comparison. The logical value that each of the respective comparators 106 outputs may be based upon whether the output of S&H circuit 102 is above or below the respective reference voltages at each respective tap 105 connected to respective comparators 106.

Encoder 108 receives the output of comparators 106 and determines a digital value based on the outputs of comparators 106. The output that encoder 108 determines is a plurality of digital bits that represents the analog input value. For example, encoder 108 outputs an n-bit digital value that represents the analog input value, where there are $2^n-1$ comparators 106.

Figure 2:
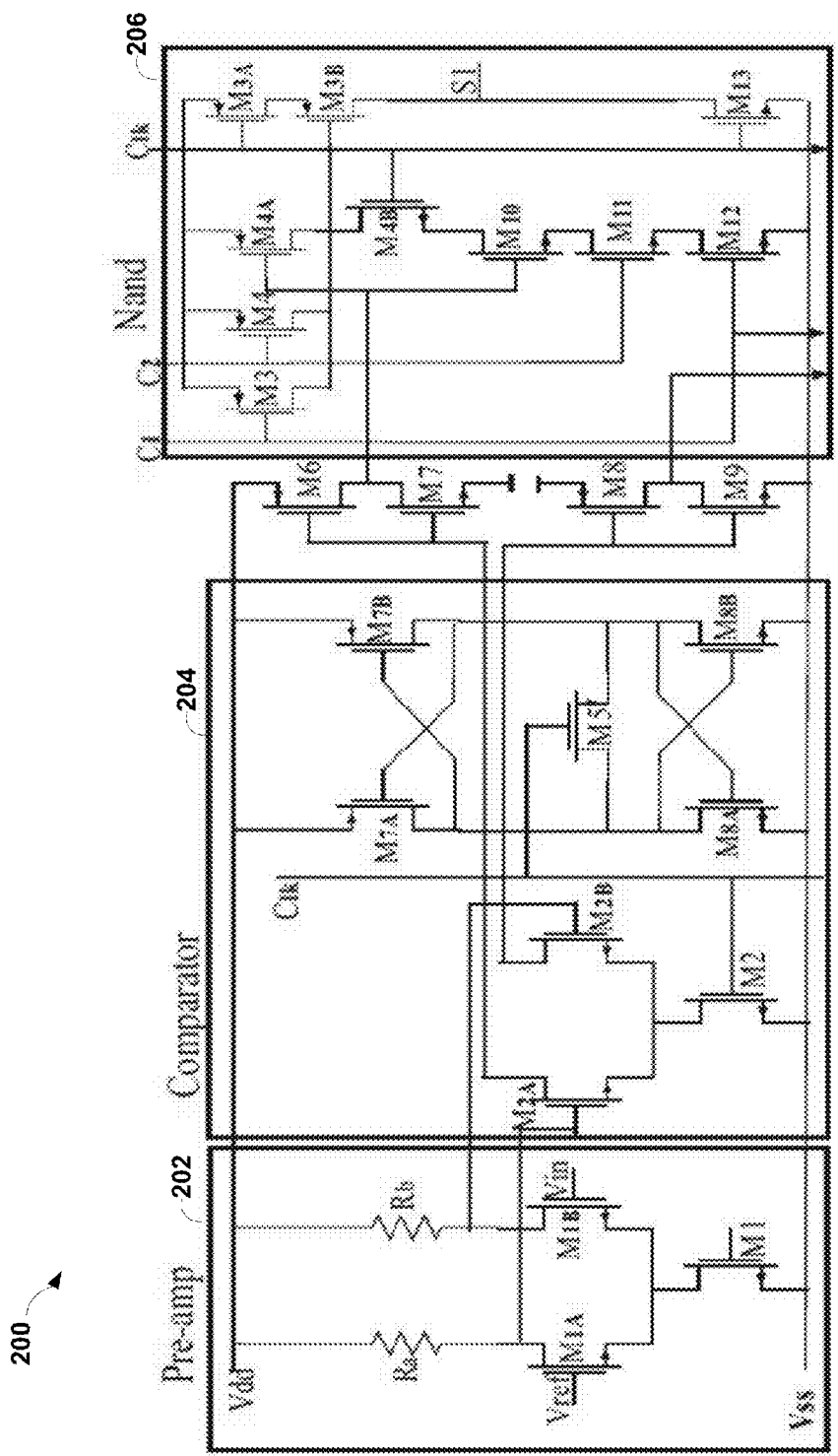
FIG. 2 is a block diagram illustrating an example of a conventional comparator of an ADC.

FIG. 2 is a block diagram illustrating an example of a conventional comparator of an ADC 200, such as comparators 106 of ADC 100 of FIG. 1. In some examples, an ADC includes a pre-amplifier 202, comparator 204, and NAND gates 206. FIG. 2 illustrates a portion of the ADC, and there may be multiple pre-amplifiers 202, comparators 204, and NAND gates 206 in an ADC. For instance, comparator 204 is an example of comparator 106. As described above, there are $2^n-1$ comparators 106 in a conventional ADC, and therefore, there may be $2^n-1$ comparators 204, each with corresponding pre-amplifiers 202 and NAND gates 206, resulting in $2^n-1$ pre-amplifiers 202 and $2^n-1$ NAND gates 206.

NAND gates 206 may latch the output of comparator 204 so that encoder 108 (FIG. 1) receives the comparison results from each of the comparators at the same time to convert the outputs of each comparator 204 to the final encoder output (e.g., the output digital value that includes digital bits that represent the analog input value). For example, after each of respective comparators 204 output the logical value indicating the result of the comparison (e.g., 0 or 1), each of respective NAND gates 206 latches the output of respective comparators 204 until all logical values from comparators 204 can be transmitted to the encoder (e.g., encoder 108) for outputting the digital value.

As illustrated in FIG. 2, pre-amplifier 202, comparator 204 and NAND gate 206 may include in excess of 20 transistors. As discussed above, a conventional n-bit ADC may include $2^n-1$ comparators, pre-amplifiers, and NAND gates. As a result, a relatively large number of transistors are needed for a relatively low resolution conventional ADC. For example, for a digital value with a resolution of only three bits, the conventional ADC includes seven comparators, pre-amplifiers, and NAND gates, for a total of at least 140 transistors. Three digital bits can represent up to eight analog values, meaning that an ADC with a resolution of three bits can only distinctly convert eight analog values. However, having ADCs with higher resolution may be desirable to distinctly represent more analog values.

For ADCs with higher resolution, the number of transistors rises exponentially, and the large number of transistors may not be energy efficient and may take up a relatively large chip area. Providing higher resolution ADCs using conventional techniques for designing ADCs may result in requiring an impractical amount of energy and chip area for supporting the number of needed transistors. In other words, conventional ADCs may be limited in resolution because the amount of energy and chip area for supporting the number of transistors needed may be impractical.

This disclosure describes example ADCs that utilize magnetoresistive device-based comparators, rather than the conventional transistor-based pre-amplifiers, comparators, and NAND gates. In some examples, the magnetoresistive device-based comparators may also be referred to as spin-based comparators because a spin current is used to set the magnetization states of the magnetoresistive devices that form the comparators. However, using a spin current to set the magnetization states is not necessary in every example. In some examples, a magnetic signal may directly set the magnetization states without needing a spin current to set the magnetization states.

The comparators, a described in this disclosure to form ADCs, may be utilize as few as one transistor and one magnetoresistive device, and may be more energy efficient and occupy less area than only transistor-based comparators. Accordingly, the ADCs described in this disclosure may provide fast analog-to-digital conversion like conventional flash-ADCs, but may require less power and area compared to conventional flash-ADCs. The reduction in power and area further promotes an increase the resolution of the ADC. Again, it should be noted that the magnetoresistive device-based comparators are not limited to flash-ADCs and may be utilized in various types of devices including ADCs other than flash-ADC.

As described in more detail below, the ADCs described in this disclosure may utilize $2^n$ magnetoresistive device-based comparators for an n-bit resolution, instead of $2^n-1$ transistor-based comparators for the n-bit resolution. Although an additional comparator may be used in the techniques described in this disclosure, the size and operation power needed for the magnetoresistive device-based comparators may be substantially less than the size and operation power needed for the transistor-based comparators. The reduction in size and power allows for the ADC to include more magnetoresistive device-based comparators than would be practical with transistor-based comparators, which in turn allows for an increase the resolution of the digital value (e.g., more bits in the digital value).

The ADC, as described in this disclosure, receives an analog input value (e.g., an analog input voltage) and coverts the analog input voltage into a digital value. The analog input voltage may be considered as an electrical analog signal (e.g., the analog input voltage may be a time-varying analog input voltage).

However, the techniques described in this disclosure are not limited to electrical analog signals, and may be extended magnetic analog signals. In magnetic analog signal, the amplitude of the analog signal is based on the magnetization.

In some examples, the techniques described in this disclosure may convert the magnetic analog signal into a digital signal. For example, the ADC converts the analog magnetic value into a digital value, where an amplitude of the analog magnetic value sets the magnetization states of the magnetoresistive devices (and in some examples, in conjunction with a reference voltage to set the magnetization state).

In some examples, the ADC, in accordance with the techniques described in this disclosure, may convert a magnetic analog signal directly into a digital signal (e.g., directly into a digital bit value that includes a plurality of digital bits). To convert a magnetic analog signal into a digital signal, some other ADCs may require an intermediate step of converting the magnetic analog signal into an electrical signal, and then converting the electrical signal into a digital bit value. In some examples, an ADC, as described in this disclosure, may not need to convert the magnetic analog signal into an electrical analog signal for conversion to a digital bit value. Rather, the ADC may directly convert the magnetic analog signal into the digital bit value without the intermediate step of magnetic analog voltage to electrical analog voltage conversion.

Figure 3B:
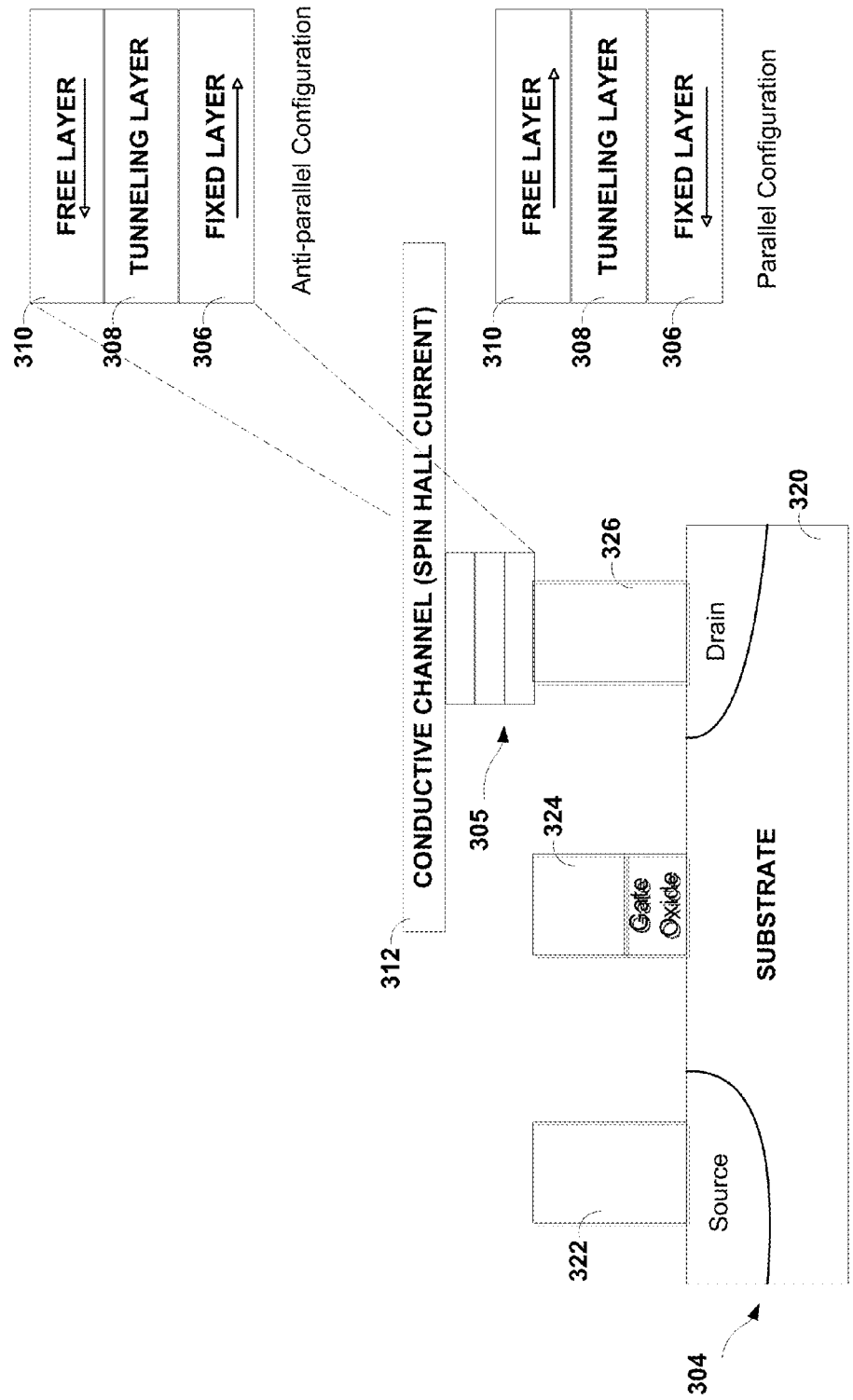
Figure 4:
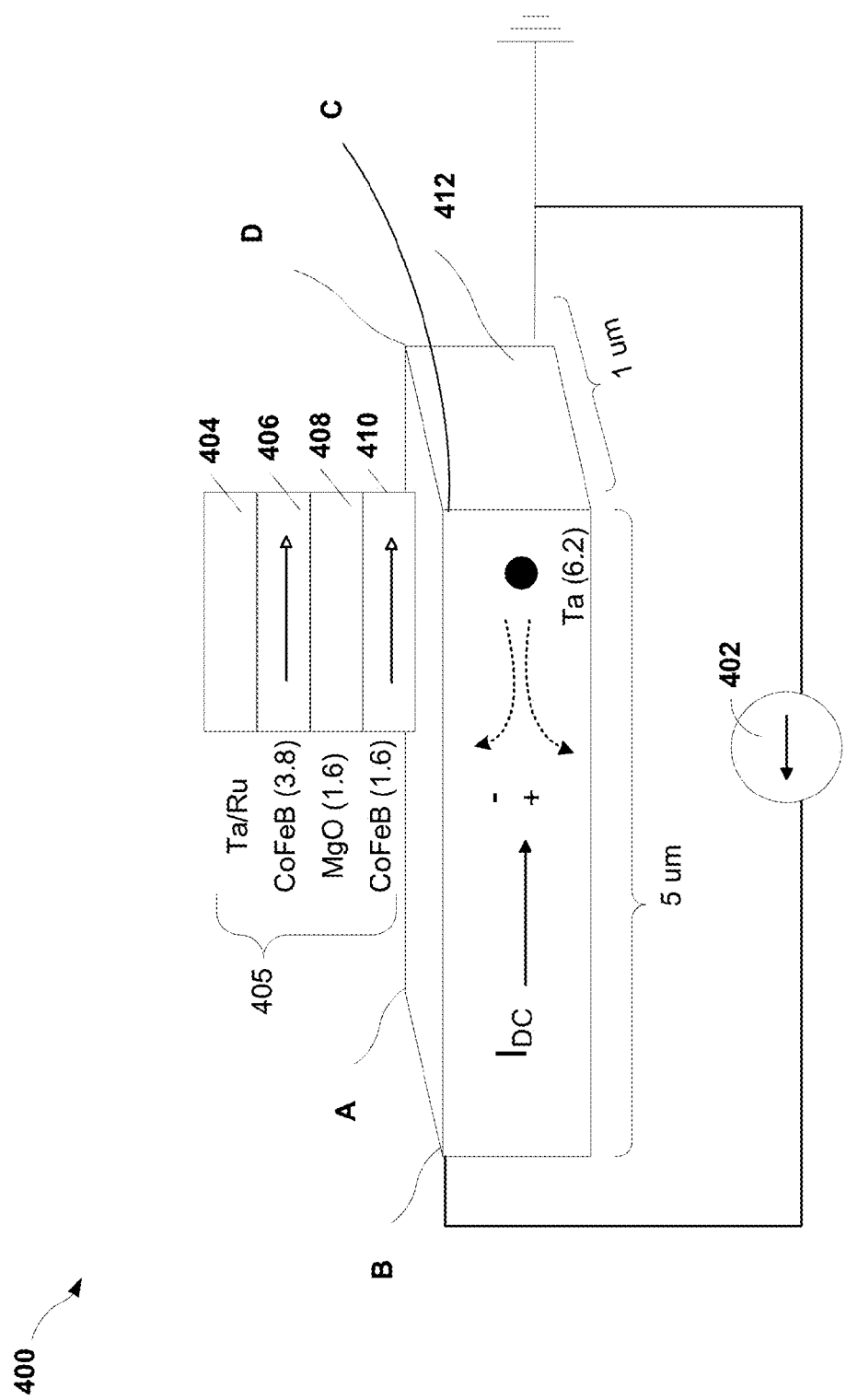
FIG. 4 is a conceptual diagram illustrating a Spin Hall Effect (SHE) used in accordance with one or more aspects of the present disclosure.
Figure 5:
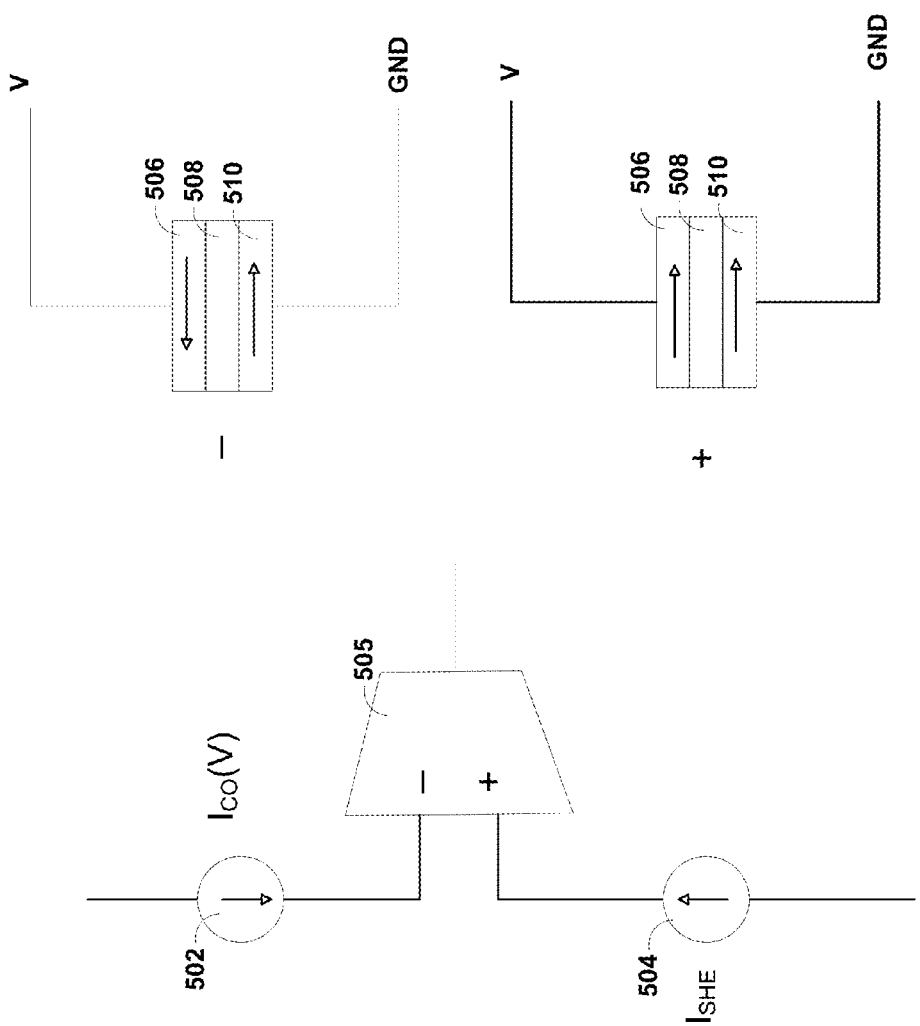
FIG. 5 is a conceptual diagram illustrating a magnetoresistive device functioning as an example comparator in accordance with one or more aspects of the present disclosure.
Figure 6:
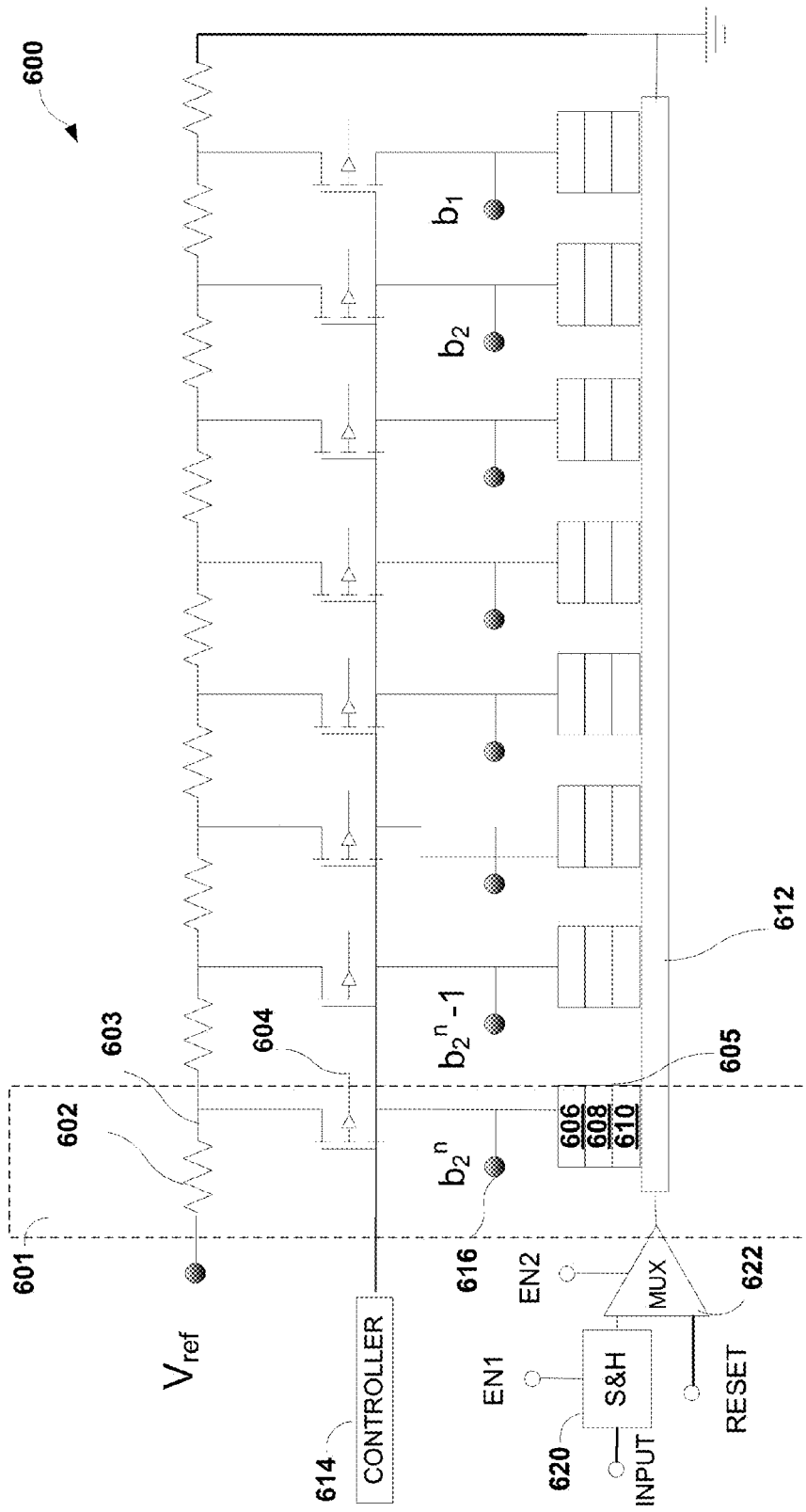
FIG. 6 is a block diagram illustrating an example ADC in accordance with one or more aspects of the present disclosure.

For ease of understanding, FIGS. 3A and 3B illustrate and their corresponding description describes magnetoresistive device-based comparators (e.g., spin-based comparators). FIGS. 4 and 5 illustrate and their corresponding description describes operation of the magnetoresistive device-based comparators. FIG. 6 and its corresponding description describes an example ADC that utilizes the magnetoresistive device-based comparators described in this disclosure.

FIGS. 3A and 3B are block diagrams that illustrate an example spin-based comparator 300 in accordance with the techniques described herein. As one example, comparator 300 may be used in an ADC (e.g., FIG. 6). For example, rather than using only conventional transistor-based comparators in an ADC, such as those illustrated in FIGS. 1 and 2, in some examples, an ADC may incorporate spin-based comparator 300. Spin-based comparator 300 is not limited to flash-based ADCs. Spin-based comparator 300 may be incorporated into other types of ADCs.

Spin-based comparator 300 may include bias voltage 302, switch 304, magnetoresistive device 305, and conductive channel (also referred to as the conductive layer) 312. As described above in FIG. 2, in a conventional ADC, the output of transistor-based comparator 204 is latched by transistor-based NAND gate 206. In the techniques described in this disclosure, the magnetization state of magnetoresistive device 305 may indicate the result of a comparison, and the magnetization state of magnetoresistive device 305 may not change until explicitly reset.

Controller 314 may selectively turn on switch 304 to apply bias voltage 302 to magnetoresistive device 305 to set the magnetization state of magnetoresistive device 305. Controller 314 may selectively turn off switch 304 so that bias voltage 302 is not applied to magnetoresistive device 305 to read the magnetization state of magnetoresistive device 305 via output signal 316 (e.g., to read the result of the comparison). By turning switch 304 on and off, controller 314 controls the flow of current through switch 304. As described below, the magnetization state of magnetoresistive device 305 may be based, at least in part, on the flow of current through switch 304.

Switch 304 may include a transistor (e.g., silicon (Si) based, gallium nitride (GaN) based) or other types of switch devices. In the illustrated example of FIGS. 3A and 3B, switch 304 includes a transistor-based MOSFET, including substrate (body) 320, source 322, gate 324, and drain 326. Switch 304 may include a plurality of inputs, including a controller voltage from controller 314 and bias voltage 304.

In some examples, a first side of switch 304 may be connected to a first side of magnetoresistive device 305, and a second side of switch 304 may be connected to a bias voltage 302. Switch 304 may be a p-channel transistor in the illustrated example, but may be an n-channel transistor in some examples.

In the techniques described in this disclosure, bias voltage 302, in combination with a current outputted from conductive channel 312, sets a magnetization state of magnetoresistive device 305. For instance, a flow of current through conductive channel 312 causes a spin current to flow to magnetoresistive device 305. In some examples, conductive channel 312 may include Tantalum (Ta), Tungsten (W), Platinum (Pt), Gold (Au), Aluminum (Al), Silver (Ag), Copper (Cu), or the like.

In some examples, conductive channel 312 may include a plurality of sub-layers. In some examples, conductive channel 312 may include a granular layer including fine grains and grain boundaries. For example, the granular layer may include a mixture of Ta, W, Pt, Au, Al, Ag, and/or Cu. The granular layer including fine grains and grain boundaries may increase the spin Hall effect, which increases the efficiency of converting the charge that enters conductive channel 312 into the spin current (e.g., makes the charge-to-spin current conversion in an effective way).

In operation, input interface 318 may generate a time varying input voltage. For instance, in examples where spin-based comparator 300 is part of an ADC, input interface 318 receives the analog input value that is to be converted to a digital value. Since voltage and current are directly proportional, the application of the input voltage across conductive channel 312 causes a current (e.g., a direct current (DC)) to flow through conductive channel 312, where the current that flows through conductive channel 312 is proportional to the input voltage.

In some examples, input interface 318 applies the input voltage across conductive channel 312 for a short-duration, which causes a pulse of the current to flow through conductive channel 312. For example, as described in more detail with respect to FIG. 6, controller 314 or some other component, may enable the output of input interface 318 to apply the input analog voltage across conductive channel for a brief duration, which causes a current pulse to flow through conductive channel 312.

For example, the analog input value may be an analog input voltage (e.g., between 0V and 0.25V). This analog input voltage may represent various sensor outputs, although the techniques are not so limited. For instance, the analog input voltage may represent a temperature reading. Input interface 318 may apply this analog input voltage for brief durations across conductive channel 312 causing a pulse of current to flow through conductive channel 312.

In other words, input interface 318 samples the analog input voltage at regular intervals and outputs the sampled analog input voltage to conductive channel 312 for a set amount of time, as determined by controller 314. The voltage that input interface 318 outputs causes a current to flow through conductive channel 312, where the amplitude of the current is based on the amplitude of the analog input voltage. As described in more detail, the current flowing through conductive channel 312 causes a spin-current to flow to magnetoresistive device 305 that sets the magnetization state of magnetoresistive device 305 (in combination with bias voltage 302).

As illustrated, comparator 300 includes at least one magnetoresistive device 305. Examples of magnetoresistive device 305 include, but are not limited to, a giant magnetoresistance (GMR) device, a magnetic tunnel junction (MTJ)

device, tunneling magnetoresistance (TMR) device, or the like. Magnetoresistive device 305 may be configured to represent a binary value (i.e., 0 or 1) based on the impedance of magnetoresistive device 305.

Magnetoresistive device 305 may include a plurality of layers, including fixed layer 306, tunneling layer 308, and free layer 310. In some examples, fixed layer 306 and free layer 310 may each be considered a different side of magnetoresistive device 305. One side of magnetoresistive device 305, fixed layer 306 may be electrically connected to drain 326 of switch 304, as illustrated in FIG. 3B. On another side of magnetoresistive device 305, free layer 310 may be electrically connected to conductive channel 312, as illustrated in FIG. 3B.

In some examples, fixed layer 306 may include a ferromagnetic material (e.g., CoFeB) having a magnetization direction. Fixed layer 306 may be pinned by an antiferromagnetic layer or synthetic antiferromagnetic layer.

Free layer 310 may include a ferromagnetic material (e.g., CoFeB) having a magnetization direction. In some examples, free layer 310 may include a HS-AOS switchable layer (e.g., switchable based on helicity) and another magnetic layer (e.g., CoFeB, CoFe, etc.) that directly contacts with tunneling layer 308. In some examples, free layer 310 may be configurable to operate in various magnetization states.

Tunneling layer 308, also referred to as insulating layer 308, may be sandwiched between fixed layer 306 and free layer 310. In some examples, tunneling layer 308 may include insulating materials such as magnesium oxide (MgO). In some examples, tunneling layer 308 may be thin enough (approximately a few nanometers) that electrons may tunnel from fixed layer 306 to free layer 310, or vice versa.

Fixed layer 306 and free layer 310 may include a magnetization direction. The magnetization direction of fixed layer 306 may be fixed so that the magnetization direction of fixed layer 306 does not change. The magnetization direction of free layer 310 may be changeable, as described below.

Magnetoresistive device 305 may include an operation state, such as a parallel (P) magnetization state or an anti-parallel (AP) magnetization state. The operation state of magnetoresistive device 305 may depend upon the magnetization direction of fixed layer 306 and free layer 310. Signal 316 may indicate an alignment of the magnetization direction of the fixed layer 306 relative to the magnetization direction of the free layer 310.

For instance, the impedance of magnetoresistive device 305, as measured at output signal 316, indicates whether the layers of magnetoresistive device 305 are aligned parallel (P) or anti-parallel (AP). For instance, if the impedance measurement indicates high impedance, magnetoresistive device 305 may be aligned anti-parallel, and if the impedance measurement indicates low impedance, magnetoresistive device 305 may be aligned parallel. The high impedance of magnetoresistive device 305 may correspond to a digital high, and the low impedance of magnetoresistive device 305 may correspond to a digital low, or vice-versa.

The magnetization orientation of fixed layer 306 and free layer 310 may be in-plane or perpendicular. In examples with in-plane orientation, the magnetization direction of fixed layer 306 and the magnetization of free layer 310 are in the plane of conductive channel 312. In examples of perpendicular orientation, also known as out-of-plane, the magnetization direction of fixed layer 306 and the magnetization of free layer 310 are normal to the plane of conductive channel 312. As illustrated in FIGS. 3A and 3B, the magnetization direction of fixed layer 306 and free layer 310 are shown in-plane. However, comparator 300 may function similarly when using a perpendicular or out-of-plane magnetization orientation.

As described above, the magnetization direction of free layer 310 is variable and setting of the magnetization direction of free layer 310 sets the magnetization state and impedance level of magnetoresistive device 305. The magnetization direction of free layer 310 may be set in accordance with the Spin-Hall Effect (SHE) and/or voltage-controlled magnetic anisotropy (VCMA).

The SHE may occur when magnetoresistive device 305 is electrically coupled to a conductive channel or film 312 and a charge current is applied to conductive channel 312. The charge current is directly proportional to an input voltage from input interface 318. As charge current flows through conductive channel 312 in the horizontal direction, the spin-orbit coupling in conductive channel 312 causes the accumulation of vertical directed spins at the top surface of conductive channel 312, thus exerting spin-transfer torque (STT) on free layer 310. The STT may then inject the accumulation of vertical directed spins of the spin-polarized current into free layer 310 of magnetoresistive device 305. As a result, the angular momentum of the spin-polarized current may be transferred to free layer 310 which may set the magnetization direction of free layer 310.

The energy required to set the magnetization direction of free layer 310 may be very low due to high spin injection efficiency and low resistance in conductive channel 312. Moreover, as described above, the fine grains and grain boundaries in conductive channel 312 may increase the Spin-Hall effect, which may make the charge-to-spin current conversion in an effective way.

In some examples, the magnetization direction of free layer 310 may be set from an electric field and VCMA. VCMA may originate from spin-dependent screening of the electric field which leads to changes in the surface magnetization and the surface magnetocrystalline anisotropy. When switch 304 is on, the voltage across switch 304 may induce an electric field due to VCMA. As such, the electric field may modify the perpendicular anisotropy of free layer 310, even if free layer 310 is polarized in-plane. In some examples, VCMA may be used to induce or assist in changing the magnetization orientation of free layer 310. In some examples, the use of VCMA may reduce or eliminate the need for large currents to change the magnetization orientation; as a result the use of VCMA may reduce power dissipation and improve the energy efficiency of magnetoresistive device 305.

In some examples, the magnetization direction of free layer 310 may be set from strain induced magnetization switching and/or exchange biasing magnetization switching. In some examples, the magnetization direction of free layer 310 may be set with SHE in combination with another technique, such as VCMA, strain induced switching, or exchange biasing. For instance, by combining SHE and VCMA, the critical changing current may be modulated by a DC voltage bias applied across magnetoresistive device 305 (e.g., by bias voltage 302) while a pulse current is driven into conductive channel 312 to attempt to change the magnetization direction of free layer 310 (e.g., by the current that flows through conductive channel 312 from the voltage output of input interface 318). Applying a VCMA voltage across switch 304 may reduce the amount of pulse current required to induce the SHE, which may improve the energy efficiency of magnetoresistive device 305.

FIG. 3A illustrates an example in which an electrical analog input value is used to set the magnetization state of magnetoresistive device 305 by causing a current to flow through conductive channel 312 based on the analog input value, which in turn causes a spin current to output to free layer 310 of magnetoresistive device 305. However, the techniques described in this disclosure are not so limited.

In some examples, the magnetization direction of free layer 310 may be set, in some examples, directly from a magnetic signal. In these examples, a magnetic signal may be applied directly to free layer 310. If the amplitude of the magnetic signal is high enough, the magnetization direction of free layer 310 may change from AP to P, or vice versa. In some examples, setting the magnetization direction of free layer 310 by a magnetic signal may not require conduction channel 312 because the magnetic signal may be applied directly to free layer 310. In other words, there may be no conversion of the magnetic signal to an electrical signal, and therefore, no current may be needed to flow through conductive channel 312 that creates the spin current. In this way, a magnetic analog value, rather than an electrical analog value, may set the magnetization state of magnetoresistive device 305, where the magnetization state of magnetoresistive device 305 is further utilized to convert the magnetic analog value into a digital value.

The disclosure describes comparator 300 with reference to flash-based ADCs for illustrative purposes only. However, the disclosure is not intended to be limited to use within an ADC. In other examples, comparator 300 may be used in other devices or in non-flash based ADCs.

FIG. 4 is a conceptual diagram illustrating a Spin Hall Effect (SHE) used in accordance with one or more aspects of the present disclosure. For instance, FIG. 4 illustrates the current flowing through conductive channel 412 to produce the SHE. Comparator 400 in FIG. 4 may be similar to comparator 300 in FIGS. 3A and 3B. Conductive channel (also referred to as the conductive layer) 412 may include Tantalum (Ta), Tungsten (W), Platinum (Pt), Gold (Au), Aluminum (Al), Silver (Ag), Copper (Cu), or the like, as described in FIGS. 3A & 3B (element 312). In some examples, conductive channel 412 may include a plurality of sub-layers. In some examples, conductive channel 412 may include a granular layer including fine grains and grain boundaries. Conductive channel 412 may be only a few nanometers thick. As illustrated in FIG. 4, in some examples, conductive channel 412 may be approximately 6.2 nm thick.

Magnetoresistive device 405 may include a plurality of layers, including a fixed layer 406, tunneling layer 408, and free layer 410, as described in FIGS. 3A and 3B (elements 305, 306, 308, and 310 respectively). In some examples, magnetoresistive device 405 may include an electrode layer 404. Electrode layer 404 may include Tantalum (Ta), Ruthenium (Ru), or the like.

In some examples, the thickness of the fixed layer 406, tunneling layer 408, and free layer 410 may be only a few nanometers thick. For example, as illustrated in FIG. 4, the thickness of each respective layer may be as follows: fixed layer 406 approximately 3.8 nm, tunneling layer 408 approximately 1.6 nm, and free layer 410 approximately 1.6 nm.

Fixed layer 406 and free layer 410 may include a magnetization direction, as described in FIGS. 3A & 3B. As described in FIGS. 3A & 3B, the magnetization direction of free layer 410 may be variable. The magnetization direction of free layer 410 is set from SHE and/or another technique such as VCMA, strain induced switching, or exchange biasing.

In operation, voltage source 402 may supply a direct current $I_{DC}$ that is proportional to the input voltage. For instance, input interface 318 is an example of voltage source 402. As described in FIGS. 3A & 3B, as current $I_{DC}$ flows through conductive channel 412, conducting channel 412 may generate a spin current that is perpendicular to the plane (defined by points A, B, C, and D) of the conductive channel 412 in accordance with the SHE. In some examples, the direction of the current $I_{DC}$ may determine the direction of the spin-current, which may change the magnetization direction of free layer 410 from parallel to anti-parallel, or vice-versa. For example, as illustrated in FIG. 4, when current $I_{DC}$ flows in a clockwise direction, the magnetization direction of free layer 410 may be parallel. To change the magnetization direction of free layer 410 to anti-parallel, the direction of current $I_{DC}$ may be changed to flow in a counter-clockwise direction.

In some examples, the magnetization direction of free layer 410 is set using VCMA. In operation, the switching current in conductive channel 412 may be dependent on the demagnetizing field in perpendicular direction, and the demagnetizing field may be modulated by voltage bias through VCMA.

FIG. 5 is a conceptual diagram illustrating a magnetoresistive device functioning as an example comparator in accordance with one or more aspects of the present disclosure. In some examples, FIG. 5 illustrates the equivalent circuit of a magnetoresistive device based comparator. The equivalent circuit may include a 2:1 multiplexer 505, with two input currents and a single output. One input current may be Spin Hall Current ($I_{SHE}$) 504, and the other input current may be the critical changing current ($I_{C0}$) 502 of the magnetoresistive device.

In some examples, the critical switching current 502 may be dependent on the demagnetizing field in a perpendicular direction, while the demagnetizing field can be modulated by a voltage bias through VCMA. In some examples, by combining the SHE spin torque and VCMA, the critical changing current 502 can then be modulated by a DC voltage bias applied across the magnetoresistive device while a pulse current is driven into the conductive channel to attempt to change the magnetization direction of the free layer 510. Thus, in the equivalent circuit, the output of multiplexer 505 may be either a 1 or 0, depending upon the magnetization direction of free layer 510.

FIG. 6 is a block diagram illustrating an example ADC in accordance with one or more aspects of the present disclosure. In some examples, spin-based ADC 600 may include a resistor ladder, a plurality of comparators 601 (e.g., similar to comparator 300 of FIG. 3A), a conductive channel (also referred to as the conductive layer) 612, controller 614, sample-and-hold (S&H) device 620, multiplexer 622, and an encoder (not shown). Similar to FIG. 1, the resistor ladder may receive a reference voltage $V_{ref}$ and include a series of "rungs." Each rung of the resistor ladder may include a resistor 602 and a tap 603 after each resistor 602. Since a voltage drop occurs across each resistor 602 in the ladder, the reference voltage at each successive rung of the ladder will have a lower voltage than the rung before it. In other words, the reference voltage at each of taps 603 is different.

As illustrated, ADC 600 includes a plurality of comparators 601. In some examples, ADC 600 may include $2^n$ comparators, where n is the number of bits outputted by ADC 600. Thus, a 2-bit spin-based ADC may include 4 comparators, a 3-bit ADC may include 8 comparators, a 4-bit ADC may include 16 comparators, and so on. Each comparator 601 may be configured to represent a binary value (i.e., 0 or 1). For instance, in the ADC illustrated in FIG. 1, there are $2^n-1$ comparators, and in the ADC illustrated in FIG. 6, there are $2^n$ comparators. Although the example illustrated in FIG. 6 includes an additional comparator, the overall size of ADC 600 may be smaller and consume less power than ADC 100 of FIG. 1 because the size of each comparator 602 may be substantially smaller than the comparators 106 of FIG. 1.

In some examples, each of the respective comparators 601 may include a rung of the resistor ladder, a switch 604, magnetoresistive device 605, and output 616. A rung of the resistor ladder includes resistor 602 and tap 603. Tap 603 may provide a reference voltage to switch 604. The reference voltage may be a divided voltage of $V_{ref}$. For instance, because there is a voltage drop across each resistor 602, the respective reference voltage at each respective tap 603 will be lower than the $V_{ref}$ at prior taps 603.

Each comparator 601 may include at least one switch 604, similar to switch 304. Switch 604 receives a controller voltage from controller 614 and reference voltage from tap 603. When the reference voltage from tap 603 is greater than the threshold voltage from controller 614, switch 604 is turned on. A first side of each switch 604 may be connected to a first side of a respective comparator 601 and a second side of each switch 604 may be connected to a respective reference voltage at a respective tap 603.

ADC 600 may include a sample-and-hold (S&H) device 620 and multiplexer 622. S&H device 620 and multiplexer 622 may together form an input interface, such as input interface 318 of FIG. 3A. In order for ADC 600 to measure an analog input value (e.g., an analog input voltage or an AC voltage) at a particular instant in time, S&H 620 may be configured to sample the analog input value and hold it for future use. S&H 620 may hold the analog input voltage, and when S&H device 620 is to output the sampled analog input voltage, controller 614 (or some other unit) may enable the EN1 pin that causes S&H device 620 to output the sampled analog input voltage. Controller 614 (or some other unit) may then disable the EN1 pin and cause S&H device 620 to stop the outputting of the sampled analog input voltage. In this way, S&H 620 outputs a pulse with a substantially similar amplitude of the analog input value (e.g., analog input voltage).

Multiplexer 622 may be electrically connected to conductive channel 612, which allows the selective application of the analog input voltage to conductive channel 612. For example, the magnetization states of magnetoresistive devices 605 do not change until explicitly reset, even if no power is applied (e.g., magnetoresistive devices 605 are non-volatile). Accordingly, the magnetization states of magnetoresistive devices 605 need to be periodically reset (e.g., every time a new comparison needs to be made). When magnetoresistive devices 605 are to be reset, controller 614 outputs a signal to the EN2 pin that allows the voltage at the RESET pin of multiplexer 622 to be applied to conductive channel 622. In normal operation (e.g., when the magnetization states of magnetoresistive devices 605 are used for analog-to-digital conversion), controller 614 (or some other unit) outputs a signal to the EN2 pin that causes multiplexer 622 to output the pulse from S&H 620.

As illustrated, comparator 601 may include at least one magnetoresistive device 605. Magnetoresistive device 605 is substantially similar to magnetoresistive device 305. For instance, fixed layer 606 corresponds to fixed layer 306, tunneling layer 608 corresponds to tunneling layer 308, and free layer 610 corresponds to free layer 310. Also, like magnetoresistive device 305, magnetoresistive device 605 may include a giant magnetoresistance (GMR) device, a magnetic tunnel junction (MTJ) device, tunneling magnetoresistance (TMR) device, or the like. In the techniques described in this disclosure, the magnetization state of magnetoresistive device 605 represents the result of a comparison performed by comparator 601.

As described above, the magnetization direction of free layer 610 is variable and setting of the magnetization direction of free layer 610 sets the magnetization state and impedance level of magnetoresistive device 605. The magnetization direction of free layer 310 may be set in accordance with the Spin-Hall Effect (SHE) and/or voltage-controlled magnetic anisotropy (VCMA). Each of the techniques for setting the magnetization direction of free layer 610 operates substantially similar to the methods described with reference to FIGS. 3A and 3B. In some examples, combining SHE with another technique such as VCMA may improve the energy efficiency of magnetoresistive device 605, and thus may improve the energy efficiency of ADC 600.

In some examples, the magnetization direction of free layer 610 may be set directly from a magnetic signal. In these examples, a magnetic signal may be applied directly to free layer 610 of each magnetoresistive device 605. If the amplitude of the magnetic signal is high enough, the magnetization direction of free layers 610 may change from AP to P, or vice versa. In some examples using a magnetic signal to set the magnetization direction of free layer 610, ADC 600 may not include S&H 620 and conduction channel 612 because the magnetic signal may be applied directly to each free layer 610. In this example, there may be no need to convert the magnetic signal into an electrical signal. Also, in these examples, the ADC may convert the analog magnetic value into a digital value.

The signal output 616 (e.g., a logical value indicative of the impedance) of each respective comparator 601 may be provided as an input into an encoder that produces as N-bit digital output value, described in more detail below. That is, the encoder may receive a plurality of $2^N$ inputs from the respective $2^N$ outputs 616 and produce an N-bit digital value. The encoder is described in more detail in FIG. 8.

In the techniques described in this disclosure, during normal operation (e.g., when magnetoresistive devices 605 are not being reset), the current that flows through conductive channel 612 is proportional to the analog input value (e.g., the analog input voltage). The spin-current that conductive channel 612 outputs may also be proportional to current that flows through conductive channel 612, which is proportional to the analog input value. Also, when switch 604 is turned on, each of magnetoresistive devices 605 receive a respective different reference voltage. In the techniques described in this disclosure, the magnetization state of each of magnetoresistive devices 605 is based on the reference voltage and the spin-current. Because the spin-current is proportional to the current flowing through conductive channel 612, and the current flowing through conductive channel 612 is proportional to the analog input value, the magnetization state of each of magnetoresistive devices 605 may be set from the different respective reference voltages and the analog input value. In other words, the magnetization state of each of magnetoresistive devices 605 may indicate whether a respective reference voltage is greater than or less than the analog input voltage.

For example, if the spin-current and the reference voltage set the magnetization state of a corresponding magnetoresistive device 605 to a parallel state, the corresponding reference voltage may be less than the analog input value, and if the spin-current and the reference voltage set the magnetization state of a corresponding magnetoresistive device 605 to an anti-parallel state, the corresponding reference voltage may be greater than the analog input value, or vice-versa. In this way, magnetoresistive devices 605 may be considered as comparators that compare the analog input value to respective reference voltages. Because the reference voltage to each one of magnetoresistive devices 605 is different, the magnetization states of each one of magnetoresistive devices 605 may different.

One of the proprieties of magnetoresistive devices 605 is that magnetoresistive devices 605 stay in their respective magnetization states even after the reference voltage and/or spin-current is removed (i.e., magnetoresistive devices 605 are non-volatile). Also, the impedance of each of magnetoresistive devices 605 is indicative of the magnetization state of each of magnetoresistive devices 605. Therefore, by determining the impedance of each of magnetoresistive devices 605, it may be possible to determine the magnetization state of magnetoresistive devices 605.

For instance, after controller 614 turns off switch 604, controller 614 may apply a voltage at respective outputs 616 and measure the current flowing through respective magnetoresistive devices 605. Based on the current and the applied voltage, controller 614 may determine the impedance of the magnetoresistive devices 605, which is indicative of the magnetization state of respective magnetoresistive devices 605. In this manner, the magnetization state (and impedance) of magnetoresistive devices 605 is indicative of the result of a comparison of the analog input voltage to respective reference voltages. Controller 614 may convert the impedance to a logical value (e.g., high impedance of magnetoresistive devices 605 is a logical one, and low impedance of magnetoresistive devices 605 is a logical zero), and output the logical values of respective magnetoresistive devices 605 to an encoder. The encoder, in turn, determines a digital value for the analog input value based on logical values representing the magnetization state (or impedance) of magnetoresistive devices 605.

In some examples, the circuitry that determines the impedance of magnetoresistive devices 605 may be part of the encoder. In these examples, a conversion of the determined impedance to a logical one or zero may not be necessary. Rather, the impedance values, without conversion, may be inputs for the encoder that determines the digital values that represent the analog input voltage.

In operation, ADC 600 may include three phases: 1) a reset phase, 2) a conversion phase, and 3) a read-out phase. The first phase in ADC operation is to reset ADC 600 into a preset state. In some examples, ADC 600 may be reset by applying a large negative spin-current (J) to set each of the respective magnetoresistive devices 605 into a preset stage. For instance, the voltage at the RESET pin of multiplexer 622 may cause a large current to flow through conductive channel 612, which in turn causes a large negative spin-current to output to each of magnetoresistive devices 605 to present magnetoresistive devices 605.

Once ADC 600 has been reset, the conversion phase may be initiated. In operation, the conversion stage includes applying a reference voltage across the resistor ladder, thus generating a different bias voltage at each tap 603 of the resistance ladder. Controller 614 may generate a controller voltage which may turn on all of the switches 604. When all of the switches 604 are on, the respective bias voltage (and thus bias current) at each switch 604 may be applied to the respective magnetoresistive device 605. In some examples, the spin-current may be proportional to the input analog voltage and the direct current. Thus, the spin-current may change the magnetization state of each of the respective magnetoresistive devices 605 where the spin-current is greater than the bias current for the respective magnetoresistive device 605. After conversion, switch 604 may be turned off. This conversion phase may be considered as a phase to set the magnetization state.

The third phase of operation of ADC 600 is the read-out phase. After the respective magnetoresistive devices 605 have been switched to the appropriate state (AP or P), controller 614 may determine the magnetization state of each respective comparator 605 and represent the magnetization state as a logical value that forms a signal output 616. In some examples, the encoder may determine the magnetization state of each respective comparator 605 and no conversion to a logical value may be needed. In such examples, the magnetization state may be considered as output signals 616.

ADC 600 may contain $2^n$ output signals 616, one for each of the comparators 601. Each respective output signal 616 may be output to an encoder (FIG. 8, 800) which may convert the respective output signals 616 into a digital value. Since the magnetoresistive devices 605 are non-volatile, the conversion results are accessible at any time. For example, after controller 614 turns off switches 604, by applying a voltage or a current at output 616 to each of magnetoresistive devices 605 and determining the current or voltage, respectively, controller 614 or the encoder may determine the impedance of magnetoresistive devices 605, and the impedance indicates the magnetization state.

In operation, ADC 600 may operate very quickly. For example, the RC (resistance-capacitance time constant) of the magnetoresistive devices 605 may be very small (e.g., less than 1 ps), hence the conversion speed may not be limited by the parasitic components. Further, since only a few switches 604 are involved during the conversion (as few as one for each magnetoresistive device 605), in some examples, the propagation delay may be negligible. In some examples, the upper limiting parameter of the conversion speed may be the switching speed of magnetoresistive device 605. In some examples, the current induced STT switching of each magnetoresistive device 605 may be as fast as about 100 ps. Hence, the conversion speed may reach up to several Gs/S.

In some examples, the approximate measurements of each magnetoresistive device 605 may be as follows:

Resistance×Area (RA): ~10 $\Omega \mu m^2$
Junction Size: ~20 nm×20 nm
R: ~25 kΩ
MgO dielectric constant: κ~7.74
MgO thickness: ~1.5 nm
MTJ capacitance: ~1.8×10$^{-17}$ F
$(RC)_{MTJ}$: ~0.46 pS Because the described ADC may reduce the number of transistors required for each comparator, ADC 600 may achieve lower write currents and lower-power consumption compared to traditional flash ADCs. ADC 600 may also occupy less chip area and have greater scalability than traditional flash ADCs. ADC 600 may retain the high sampling rate and non-volatile storage capabilities of traditional flash ADCs. In contrast to transistor based CMOS circuits, ADC 600 may retain its state even if the device is not receiving power.

Figure 7:
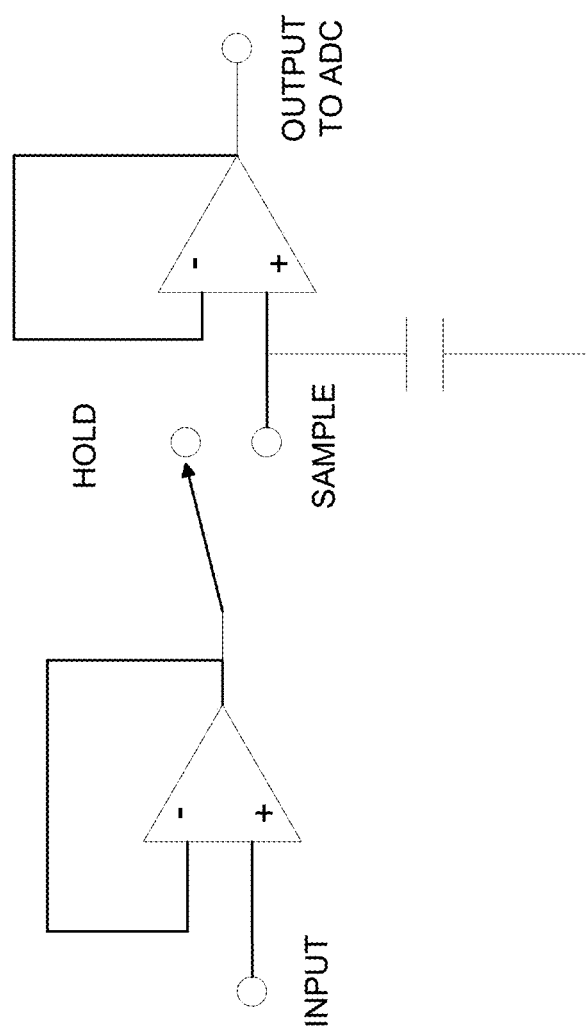
FIG. 7 is a block diagram illustrating an example sample-and-hold circuit in accordance with one or more aspects of the present disclosure.

FIG. 7 is block diagram illustrating an example sample-and-hold circuit in accordance with one or more aspects of the present disclosure, which is an example of S&H device 620 of FIG. 6. In some examples, the S&H device may include an input signal, one or more operational amplifiers, and at least one capacitor. The S&H device may hold the signal and a pulse with the same amplitude of the signal may generated by pulse generator. The pulse may be output to conductive channel 612 which may switch some of magnetoresistive devices 605 with lower thresholds.

Figures 8, 9:
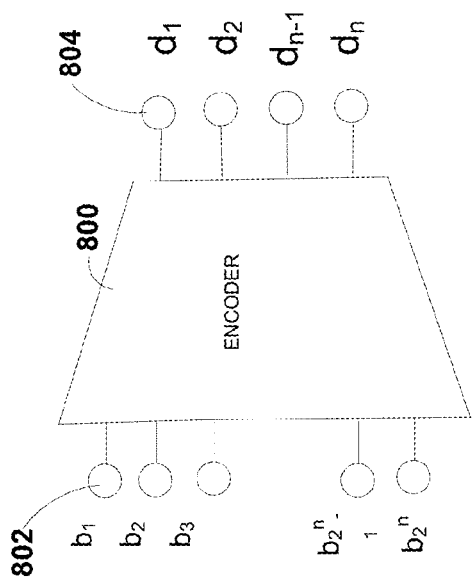
FIG. 8 is a block diagram illustrating an example encoder in accordance with one or more aspects of the present disclosure.
FIG. 9 is a chart illustrating an example mapping between magnetization states and digital bit output in accordance with one or more aspects of the present disclosure.

FIG. 8 is block diagram illustrating an example encoder 800 in accordance with one or more aspects of the present disclosure. Encoder 800 may include a plurality of input signals 802, where the combination of input signals 802 corresponds to an analog input value. Encoder 800 may output a digital value representative of the analog input value. As described above in reference to FIG. 6, ADC 600 may include n-bit encoder to produce an n-bit digital value based on output signals 616 received from comparators 601. For example, as shown in FIG. 6, ADC 600 may include $2^n$ comparators 601, and each comparator 601 may produce a respective output signal 616, illustrated as $b_1$ to $b_2^n$.

In some examples, controller 614 may determine the logical value that represents the magnetization state of respective magnetoresistive devices 605 (e.g., by determining the impedance of respective magnetoresistive devices 605). For example, if controller 614 determines that magnetoresistive device 605 associated with $b_2^n$ is in the parallel magnetization state (e.g., low impedance), controller 614 may set the logical value of 0 for output signal 616 associated with $b_2^n$, and if controller 614 determines that magnetoresistive device 605 associated with $b_2^n$ is in the anti-parallel magnetization state (e.g., high impedance), controller 614 may set the logical value of 1 for output signal 616 associated with $b_2^n$, or vice-versa. Controller 614 may similar set the logical values for output signals 616 associated with $b_2^n{}_{-1}$ to $b_1$. Controller 614 may provide each respective output signal 616 to a respective encoder input 802.

In some examples, encoder 800 may determine the impedance levels of magnetoresistive devices 605. Based on the impedance level, encoder 800 may determine the digital bit value that represents the analog input voltage. In such examples, the determined impedance levels of magnetoresistive devices 605 may be considered as output signal 616.

As illustrated in FIG. 8, encoder 800 includes inputs $b_2^n$ to $b_1$, which correspond to respective output signals 616 associated with $b_2^n$ to $b_1$, as illustrated in FIG. 6. For instance, encoder 800 may receive the $2^n$ input values 802 from the $2^n$ comparators 601 in ADC 600 and encode the respective $2^n$ encoder inputs 802 to output an n-bit digital value that represents the analog input value. For example, encoder 800 may utilize a look-up table to output an n-bit value, as described in more detail with respect to FIG. 9. In this way, an n-bit digital value may readily be output based on the magnetization states of magnetoresistive devices 605.

FIG. 9 is a chart illustrating an example mapping between magnetization states and digital bit output in accordance with one or more aspects of the present disclosure. The chart (also referred to as a look-up table) in FIG. 9 illustrates a 4-bit encoder (n=4). The leftmost column of the chart includes the analog input voltage 902, the middle column represents the comparator output for each of the respective 16 ($2^4$) comparator outputs 904, and the rightmost column represents the 4 output bits output by the encoder. As the analog input voltage (and thus current that flows through conductive channel 612) increases, additional comparators are turned on, depending on the reference voltage at which each of the respective magnetoresistive devices are set to change magnetization states. For instance, in the chart, in the column illustrating comparator outputs 904, a 0 represents one magnetization state, and a 1 represents another magnetization state (e.g., parallel and anti-parallel, or vice-versa).

For example, when the analog input voltage is 0, all of comparators 601 indicate that the respective voltage is greater than the analog input voltage. In this example, each of respective magnetoresistive devices 605 may be in the parallel magnetization state. Controller 614 may determine that in the parallel magnetization state, respective output signals 616 are equal to a logical zero, as illustrated in FIG. 9. Encoder 800 may determine that the digital output for comparator output of all logical zeros is 0000 based on the look up tabled illustrated in FIG. 9. As another example, when the analog input voltage is 0.25, all of comparators 601 indicate that the respective voltage is less than the analog input voltage. In this example, each of respective magnetoresistive devices 605 may be in the anti-parallel magnetization state. Controller 614 may determine that in the anti-parallel magnetization state, respective output signals 616 are equal to a logical one, as illustrated in FIG. 9. Encoder 800 may determine that the digital output for comparator output of all logical zeros is 1111 based on the look up tabled illustrated in FIG. 9.

As yet another example, when the analog input voltage is 0.125, half of comparators 601 indicate that the respective voltage is greater than the analog input voltage, and the other half of comparators 601 indicate that the respective voltage is less than the analog input voltage. In this example, half of the magnetoresistive devices 605 may be in the parallel magnetization state, and the other half in the anti-parallel magnetization state. Controller 614 may determine that in the parallel magnetization state, respective output signals 616 are equal to a logical zero, and in the anti-parallel magnetization state, respective output signals 616 are equal to a logical one, as illustrated in FIG. 9. Encoder 800 may determine that the digital output for comparator output of half logical zeros and half logical ones is 1000 based on the look up tabled illustrated in FIG. 9.

Figure 10:
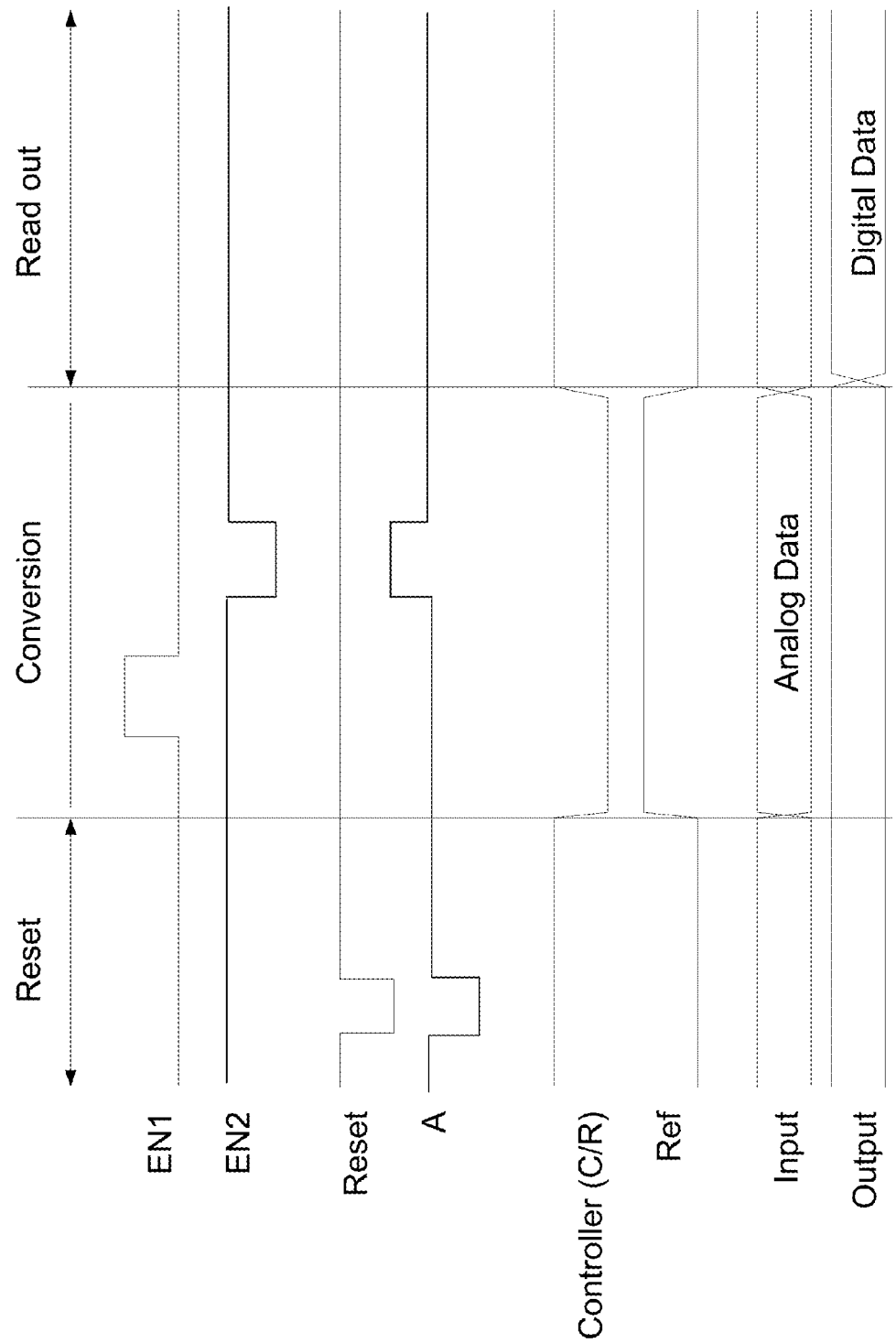
FIG. 10 is a timing diagram illustrating operation of an example ADC in accordance with one or more aspects of the present disclosure.

FIG. 10 is a timing diagram illustrating operation of an example ADC in accordance with one or more aspects of the present disclosure. As described in FIG. 6, ADC 600 may include three phases of operation: 1) reset, 2) conversion, and 3) read-out.

During the reset phase, controller 614 may cause S&H 620 to not output the analog input voltage to MUX 622 by outputting a voltage to the EN1 pin. Also, controller 614 may set the voltage at the EN2 pin such that MUX 622 selects, as the input, the voltage from the RESET. In addition, controller 614 may disable switches 604 by outputting a high voltage, as illustrated in FIG. 10.

During the reset phase, MUX 622 may receive a negative voltage via the RESET input for a short duration, as illustrated in FIG. 10. Because MUX 622 is configured to select the RESET as the input during the reset phase, MUX 622 outputs the negative voltage to channel 612. The application of the negative voltage causes a negative current to flow through channel 612 for a brief duration, as illustrated by the timing diagram labeled "A" in FIG. 10. This negative current through channel 612 causes channel 612 to output a spin current that resets magnetoresistive devices 605.

In the conversion phase, controller 614 causes S&H 620 to output the analog input voltage for a brief duration by setting the voltage of the EN1 pin, and causes MUX 622 to output the analog voltage from S&H 620 by setting the voltage of the EN2 pin. This in turn causes MUX 622 to output a DC voltage to channel 612, and the DC voltage to channel 612 causes a positive current to flow through channel 612, as illustrated by timing diagram labeled "A" in FIG. 10.

The flow of current through channel 612 causes a spin current to flow to magnetoresistive devices 605 during the conversion phase. As illustrated in FIG. 10, during the conversion phase, controller 614 turn on switches 604 by outputting a low voltage to switches 604, which causes the reference voltage to be applied to respective magnetoresistive devices 605. The combination of the spin current and the applied reference voltage sets the magnetization state of magnetoresistive devices 605. For instance, because the spin current is based on the analog input voltage, the magnetization states of magnetoresistive devices 605 will be set by the analog input voltage.

In the read out phase, controller 614 turns off switches 604 by outputting the low voltage to switches 604, which causes the reference voltage to no longer be applied to respective magnetoresistive devices 605. Although the reference voltage is no longer applied to respective magnetoresistive devices 605 and there is no current flowing through channel 614, magnetoresistive devices 605 maintain their magnetization state. For example, in the read-out stage, conductive channel 612 and switches 604 are cut off to allow the encoder 800 to read and convert the results.

FIG. 11 is a flowchart illustrating an example method of operating an example ADC in accordance with one or more aspects of the present disclosure. For purposes of illustration only, the method of FIG. 11 will be explained with reference to the example ADC described FIG. 6; however, the method may apply to other examples.

In some examples, ADC 600 may receive an analog input voltage (1102). The analog input voltage may be sampled by S&H 620 and held for future use. In some examples, S&H 620 may output a pulse with the same amplitude as the analog input voltage to the conductive channel (also referred to as the conductive layer) 612.

ADC 600 may also receive a reference voltage $V_{ref}$. In some examples, the reference voltage may be applied to a resistor ladder. The resistor ladder may include a series of rungs; each rung may include a resistor 6020 and tap 603. Since there is a voltage drop across each resistor 602, the reference voltage at each tap 603 will be different. Each of the switches 604 may receive the respective reference voltages at a first side of the respective switch 604.

Controller 614 may output a controller output voltage to turn switches 604 on and off. When the switches 604 are on, a current associated with the respective reference voltage at each switch 604 may flow through the respective switch 604 such that the respective reference voltage is applied to the respective magnetoresistive device 605.

Each magnetoresistive devices 605 may receive one of the respective reference voltages (1104). Each reference voltage may be received at a first side of the respective magnetoresistive devices 605. Each magnetoresistive device 605 may also receive a spin-current (1106). As the pulse flows horizontally through conductive channel 612, the SHE creates a vertical spin-current that accumulates at one side of conductive channel 612. The spin-current may be received by a second side of the respective magnetoresistive devices 605 from conductive channel 612.

After the direct current pulse generates a spin-current in the conductive channel, ADC 600 may set the magnetization state of each of the plurality the magnetoresistive devices 605. In some examples, if the Spin-Hall current is greater than the current associated with the reference voltage at each respective magnetoresistive device 605, the magnetization state of the respective magnetoresistive device 605 may be changed from parallel to anti-parallel (or vice versa). However, if the Spin-Hall current is less than or equal to the current associated with the reference voltage at each respective magnetoresistive device 605, the magnetization state of the respective magnetoresistive device 605 will remain unchanged.

Once the magnetization state of magnetoresistive devices 605 are set, controller 614 may turn off switches 605 and shut off the direct current through conductive channel 612. Then, ADC 600 may determine the magnetization state of each of the plurality of magnetoresistive devices 605 (1108). In some examples, the magnetization state of magnetoresistive devices 605 may be determined by measuring the impedance of the respective devices 605, where the impedance corresponds to a digital high or digital low (e.g., high impedance, digital high, low impedance, digital low, or vice-versa).

After the magnetization states of magnetoresistive devices 605 are determined, encoder 800 may encode an n-bit digital value based on the determined magnetization states (1110), where n is any positive integer. The n-bit digital value represents the analog input voltage. In some examples, ADC 600 may determine the magnetization state of $2^n$ magnetoresistive devices, and encoder 800 may output an n-bit value.

Simulation results show that, in some examples, the input analog signal can be converted into digital signal with very fast speed (up to 9 GHz) and high resolution, while the quantization power consumption is estimated to be 0.23 pJ. This result shows a significant improvement in quantization energy, indicating the possibility to broaden the existing ADC boundary on power consumption.

Table 1 shows example device parameters from the simulated device, according to some examples. Table 2 lists simulation results of one example ADC and compares with other results, showing improvement on delay and power dissipation.

TABLE 1

| Design Parameter | Value in Simulation |
| --- | --- |
| Saturation magne (Ms) | $1.1 \times 10^6$ A/m |
| Coercivity at zero bias | 50 Oe |
| $H_{demag}$ | $d(H_{demag})/dV_{MTJ} = 710$ Oe/V |
| SHM resistivity | 190 μΩ · cm |
| SHM dimension | W = 100 nm, L = 180 nm, thickness = 2 nm |
| Spin Hall angle | 0.15 |
| Gilbert damping coefficient (α) | 0.025 |
| MgO thickness ($t_{ox}$) | 1.6 nm |
| Energy barrier | 45.7 $k_B T$ |
| CoFeB resistivity | 170 μΩ · cm |

TABLE 2

| | Simulation | Conventional three stage comparator | Differential comparator | Latch based comparator | Comparator with Hysteresis |
| --- | --- | --- | --- | --- | --- |
| Delay | 0.46 ps | 0.168 ns | 0.54 ns | 0.09532 ns | 0.435 ns |
| Speed | 9 GHz | 5.59 GHz | 1.09 GHz | 8.79 GHz | 9.28 GHz |
| Power Dissipation | 0.038 mW | 0.1034 mW | 0.338 mW | 1.79 mW | 2.09 mW |
| Area | | 197.08 μm² | 213.35 μm² | 168.36 μm² | 197.134 μm² |

Various examples have been described. These and other examples are within the scope of the following claims.

What is claimed is:

1. A device comprising:
  a conductive layer configured to output a spin-current based on an analog input value;
  a plurality of magnetoresistive devices, each configured to receive a different reference voltage on a first side and the spin-current on a second side, wherein a magnetization state of each of the magnetoresistive devices is set by respective reference voltages and the spin-current; and
  an encoder configured to output a digital value including a plurality of digital bits that is a digital representation of the analog input value based on the magnetization states of the magnetoresistive devices.

2. The device of claim 1, further comprising:
a plurality of switches, wherein a first side of each of the switches is connected to the first side of respective magnetoresistive devices and a second side of each of the switches is connected to respective different reference voltages; and
a controller configured to turn on and turn off the switches to control output of the different reference voltages to respective magnetoresistive devices.

3. The device of claim 2, wherein the controller is configured to turn on the switches to output the different reference voltages to respective magnetoresistive devices to set the magnetization state of the magnetoresistive devices and turn off the switches after the magnetization state of the magnetoresistive devices is set, and wherein the encoder is configured to receive information indicative of the magnetization states of the magnetoresistive devices after the controller turns off the switches and output the digital value that represents the analog input value based on the received information.

4. The device of claim 3, wherein the magnetization state of each of the magnetoresistive devices corresponds to a respective impedance of each of the magnetoresistive devices, wherein the information indicative of the magnetization states comprises the impedance of each of the magnetoresistive devices, and wherein the encoder is configured to determine the respective impedance of each of the magnetoresistive devices and output the digital value that is the digital representation of the analog input value based on the determined impedances of the magnetoresistive devices.

5. The device of claim 2, further comprising:
a resistor ladder comprising a plurality of resistors and connected to a voltage source, wherein the resistor ladder includes a plurality of taps between the plurality of resistors connected to the second side of respective switches, and wherein the respective taps output the different reference voltages to respective switches.

6. The device of claim 1, wherein the number of digital bits in the digital value is based on the number of magnetoresistive devices.

7. The device of claim 5, wherein there are n number of digital bits in the digital value, wherein the encoder includes an n-bit encoder, and the device includes $2^n$ magnetoresistive devices.

8. The device of claim 1, further comprising a sample-and-hold circuit configured to receive the analog input value, and output a pulse with the same amplitude as the analog input value to the conductive layer, wherein the conductive layer outputs the spin-current based on the received pulse.

9. The device of claim 1, further comprising:
a sample-and-hold circuit configured to receive the analog input value;
a plurality of switches, wherein a first side of each of the switches is connected to the first side of respective magnetoresistive devices and a second side of each of the switches is connected to respective different reference voltages;
a controller configured to:
turn on the switches to output the different reference voltages to respective magnetoresistive devices;
cause the sample-and-hold circuit to output a pulse with the same amplitude as the analog input value to the conductive layer, wherein the conductive layer outputs the spin-current based on the received pulse to set the magnetization states of each of the magnetoresistive devices; and
turn off the switches after the magnetization states of each of the magnetoresistive devices is set,
wherein the encoder is configured to determine an impedance of each of the magnetoresistive devices based on the respective magnetization states of each of the magnetoresistive devices and output the digital value that is the digital representation of the analog input value based on the determined impedances of the magnetoresistive devices.

10. The device of claim 1, wherein each of the plurality of magnetoresistive devices comprise magnetic tunnel junctions (MTJs), wherein each MTJ includes an insulator layer sandwiched between two magnetic layers.

11. The device of claim 1, wherein each of the plurality of magnetoresistive devices comprise a metallic current-perpendicular-to the plane giant magnetoresistive (GMR) device, wherein each GRM device includes a non-magnetic metal layer sandwiched between two magnetic layers.

12. The device of claim 1, wherein the conducting layer comprises a plurality of sub-layers, wherein each of the plurality of sub-layers includes one of Ta, W, Pt, Au, Al, Ag or Cu.

13. The device of claim 1, wherein the conducting layer comprises a granular layer including fine grains and grain boundaries, wherein the granular layer includes a mixture of two or more elements of a group of elements including Ta, W, Pt, Au, Al, Ag and Cu.

14. An analog-to-digital converter (ADC) comprising:
a first magnetoresistive device configured to receive a first reference voltage and a spin-current, wherein an amplitude of the spin-current is based on an amplitude of an analog input value, and wherein the first reference voltage and the spin-current set a magnetization state of the first magnetoresistive device to a first magnetization state; and
a second magnetoresistive device configured to receive a second, different reference voltage and the spin-current, wherein the second reference voltage and the spin-current set a magnetization state of the second magnetoresistive device to a second magnetization state, wherein the first magnetization state and the second magnetization state are used to determine a digital value that includes a plurality of digital bits and that is a digital representation of the analog input value.

15. The ADC of claim 14, further comprising:
a plurality of magnetoresistive devices including the first magnetoresistive device and the second magnetoresistive device, wherein each of the plurality of magnetoresistive devices is configured to receive different reference voltages and the spin-current to set magnetization states of respective magnetoresistive devices, and wherein the magnetization states of the plurality of magnetoresistive devices are used to determine the digital value that includes the plurality of digital bits and that is the digital representation of the analog input value.

16. The ADC of claim 15, wherein there are n number of digital bits in the digital value, and wherein the number of magnetoresistive devices equals $2^n$.

17. A method for analog-to-digital conversion, the method comprising:
receiving an analog input voltage;
receiving, with a plurality of magnetoresistive devices, a spin-current, wherein the spin-current is based on the analog input voltage;
receiving, with the plurality of magnetoresistive device, reference voltages, wherein each of the reference voltages is different and is applied to a respective one of the magnetoresistive devices;

determining magnetization states for each of the magnetoresistive devices, wherein a magnetization state of each of the magnetoresistive devices is set by the received spin-current and the received respective reference voltage; and encoding a digital value including a plurality of digital bits based on the determined magnetization states, wherein the digital value represents the analog input voltage.

18. The method of claim 17, wherein there are n number of digital bits in the digital value, and wherein determining magnetization states for each of the magnetoresistive devices comprises determining magnetization states for each of $2^n$ magnetoresistive devices.

19. The method of claim 17, further comprising:

outputting a pulse with a same amplitude as the analog input voltage to a conductive layer, wherein receiving, with the plurality of magnetoresistive devices, the spin-current comprises receiving, with the plurality of magnetoresistive devices, the spin-current from the conductive layer.

20. The method of claim 17, further comprising:

applying a voltage to a resistor ladder, wherein receiving, with the plurality of magnetoresistive device, the reference voltages comprises receiving, with respective magnetoresistive devices, different reference voltages from taps on the resistor ladder.

21. The method of claim 17, further comprising:

turning on respective switches to cause the magnetoresistive devices to receive the reference voltages and to set the magnetization states of the magnetoresistive devices; and turning off the switches after the magnetization states of the magnetoresistive devices are set, wherein determining the magnetization states for each of the magnetoresistive devices comprises determining the magnetization states for each of the magnetoresistive devices after turning off the switches.

22. A comparator comprising:

a reference voltage;

a conductive layer configured to output a spin-current based on an analog input value; and a magnetoresistive device configured to receive the reference voltage and the spin-current, wherein the reference voltage and the spin-current set a magnetization state of the magnetoresistive device, and wherein the magnetization state of the magnetoresistive device is indicative of whether the reference voltage is greater than or less than the analog input value.

23. A device comprising:

a plurality of magnetoresistive devices, each configured to receive a different reference voltage on a first side and an analog magnetic value on a second side, wherein a magnetization state of each of the magnetoresistive devices is set by respective reference voltages and an amplitude of the analog magnetic value; and an encoder configured to output a digital value including a plurality of digital bits that is a digital representation of the analog magnetic value based on the magnetization states of the magnetoresistive devices.

* * * * *